(12) United States Patent
Sverdlik et al.

(10) Patent No.: US 12,402,241 B2
(45) Date of Patent: Aug. 26, 2025

(54) COOLING OF ULTRASOUND ENERGIZERS MOUNTED ON PRINTED CIRCUIT BOARDS

(71) Applicant: Sofwave Medical Ltd., Yokneam Illit (IL)

(72) Inventors: Ariel Sverdlik, Tel-Aviv (IL); Erez Panir, Kfar Yona (IL)

(73) Assignee: Sofwave Medical Ltd., Yokneam Illit (IL)

( * ) Notice: Subject to any disclaimer, the term of this patent is extended or adjusted under 35 U.S.C. 154(b) by 0 days.

(21) Appl. No.: 18/438,554

(22) Filed: Feb. 12, 2024

(65) Prior Publication Data

US 2024/0196514 A1    Jun. 13, 2024

Related U.S. Application Data

(63) Continuation of application No. 18/215,971, filed on Jun. 29, 2023, now Pat. No. 11,903,118, which is a
(Continued)

(51) Int. Cl.
*H05K 1/02* (2006.01)
*B06B 1/00* (2006.01)
*B60B 1/00* (2006.01)

(52) U.S. Cl.
CPC ............. *H05K 1/0204* (2013.01); *B06B 1/00* (2013.01); *H05K 1/0209* (2013.01); *H05K 1/021* (2013.01); *B06B 2201/40* (2013.01)

(58) Field of Classification Search
CPC .......... H05K 1/0201–0212; H05K 1/181–188; H05K 1/0271; H05K 1/032; H05K 7/20272; H05K 7/2039; H05K 7/20454; H05K 7/20463; H05K 7/20472; H05K 7/205; H05K 7/2089–209; H05K 7/20772; H05K 7/20872; H05K 7/20927; H05K 2201/06–068; H05K 2201/10166; H05K 2201/10416; H01L 23/46; H01L 23/50; H01L 23/473; H01L 23/34; H01L 23/36–3675; H01L 23/373;
(Continued)

(56) References Cited

U.S. PATENT DOCUMENTS 10,194,526 B1    1/2019  Simula et al.
2009/0182231 A1  7/2009  Barthe et al.
(Continued)

FOREIGN PATENT DOCUMENTS

CN       1387746         12/2002
WO   WO 2020/193412     10/2020
WO   WO 2022/144895      7/2022

OTHER PUBLICATIONS

International Preliminary Report on Patentability Dated Jul. 13, 2023 From the International Bureau of WIPO Re. Application No. PCT/IL2021/051558 (12 Pages).
(Continued)

*Primary Examiner* — Amir A Jalali

(57) ABSTRACT

An assembly including:
a printed circuit board (PCB) having a first surface and a second surface;
at least one energy transmitter mounted on the first surface;
at least one cooling element associated with the PCB second surface, wherein the cooling element is configured to cool the at least one energy transmitter via the PCB.

25 Claims, 19 Drawing Sheets

Related U.S. Application Data continuation of application No. PCT/IL2021/051558, filed on Dec. 30, 2021.

(60) Provisional application No. 63/132,629, filed on Dec. 31, 2020.

(58) Field of Classification Search
CPC ............. H01L 23/3733; H01L 23/3735; H01L 23/3736; H01L 23/42; H01L 2224/16227; H01L 2224/32245; H01L 2224/32506
See application file for complete search history.

(56) References Cited

U.S. PATENT DOCUMENTS

| | | | | |
|---|---|---|---|---|
| 2011/0272179 | A1* | 11/2011 | Vasoya | H05K 1/0204 29/846 |
| 2013/0134834 | A1 | 5/2013 | Yoshikawa et al. | |
| 2013/0208572 | A1* | 8/2013 | Klee | B06B 1/0688 367/140 |
| 2013/0315035 | A1* | 11/2013 | Tai | A61B 8/4494 367/140 |
| 2015/0319880 | A1 | 11/2015 | Strickland et al. | |
| 2016/0036412 | A1* | 2/2016 | Suzuki | B06B 1/067 310/311 |
| 2018/0161016 | A1 | 6/2018 | Choi et al. | |
| 2019/0105520 | A1* | 4/2019 | Sverdlik | B06B 3/00 |
| 2019/0110357 | A1 | 4/2019 | Gavagnin et al. | |
| 2019/0132983 | A1 | 5/2019 | Weis et al. | |
| 2019/0224501 | A1 | 7/2019 | Burdette | |
| 2019/0254157 | A1 | 8/2019 | Kotlar | |
| 2020/0287126 | A1 | 9/2020 | Chang | |
| 2021/0108866 | A1* | 4/2021 | Lucht | A61B 8/44 |
| 2021/0181041 | A1* | 6/2021 | Tang | H10N 30/875 |
| 2022/0008112 | A1* | 1/2022 | Sverdlik | A61B 18/0206 |
| 2022/0015227 | A1* | 1/2022 | Ogawa | H05K 3/0064 |
| 2023/0333066 | A1* | 10/2023 | Akhbari | G01N 29/44 |
| 2023/0345615 | A1 | 10/2023 | Sverdlik et al. | |

OTHER PUBLICATIONS

International Search Report and the Written Opinion Dated Apr. 27, 2022 From the International Searching Authority Re. Application No. PCT/IL2021/051558. (17 Pages).

Interview Summary Dated Dec. 27, 2023 from the US Patent and Trademark Office Re. U.S. Appl. No. 18/215,971. (2 pages).

Notice of Allowance together with Interview Summary Dated Sep. 26, 2023 From the US Patent and Trademark Office Re. U.S. Appl. No. 18/215,971. (21 Pages).

Supplementary European Search Report and the European Search Opinion Dated Oct. 16, 2024 From the European Patent Office Re. Application No. 21914881.4. (7 Pages).

* cited by examiner

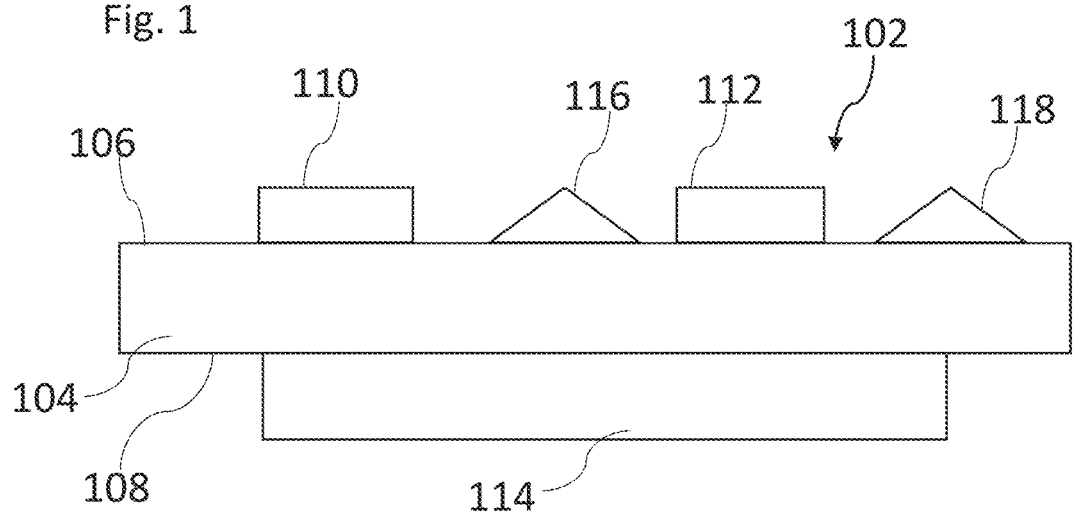
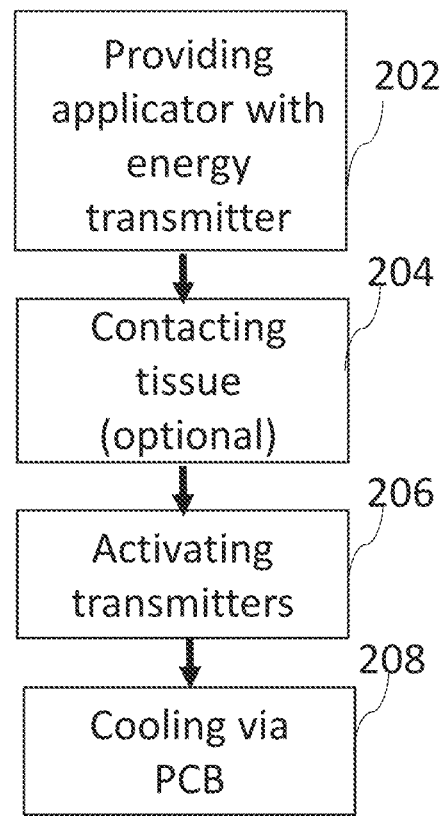

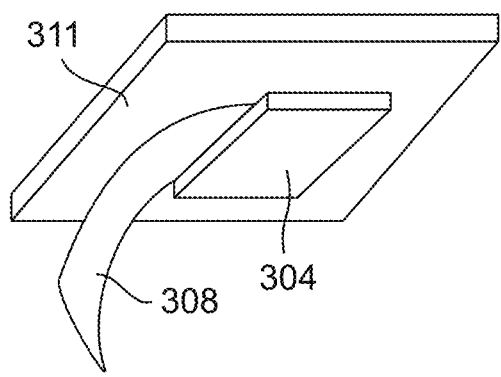
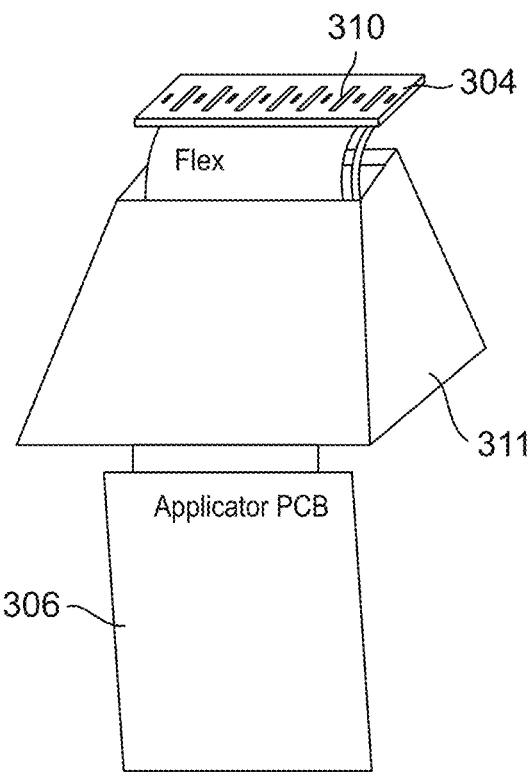
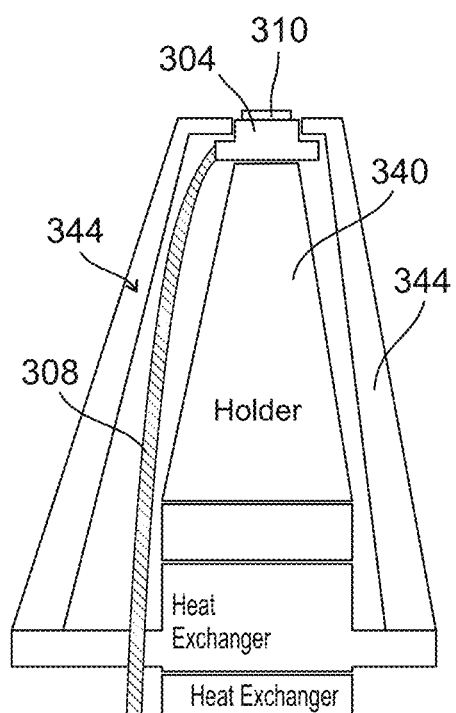
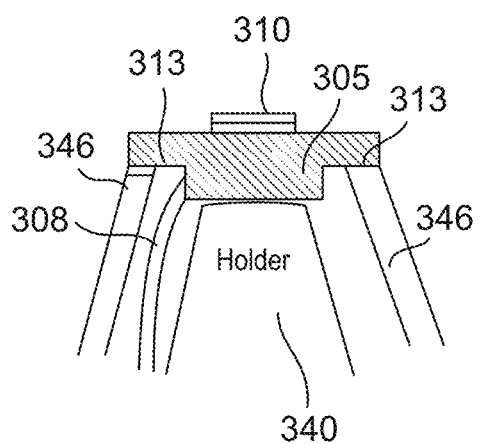
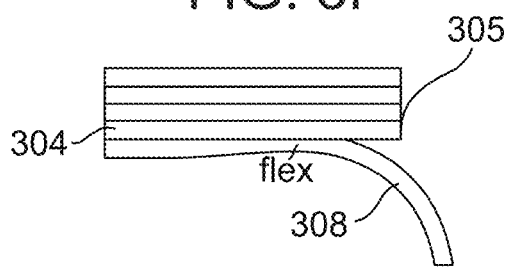

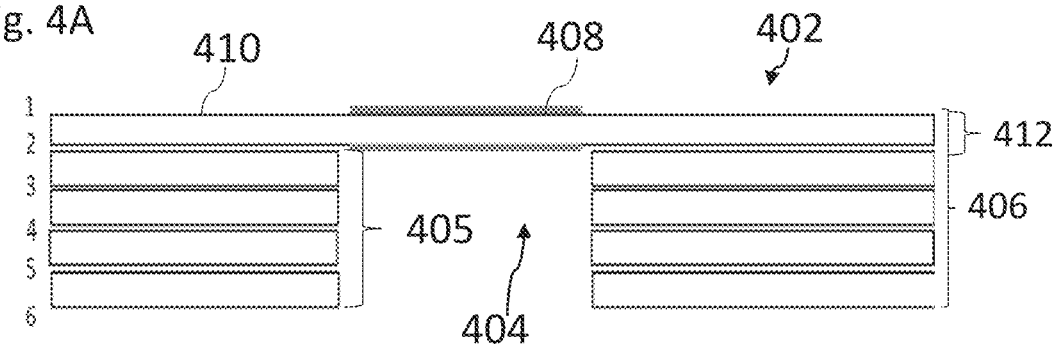
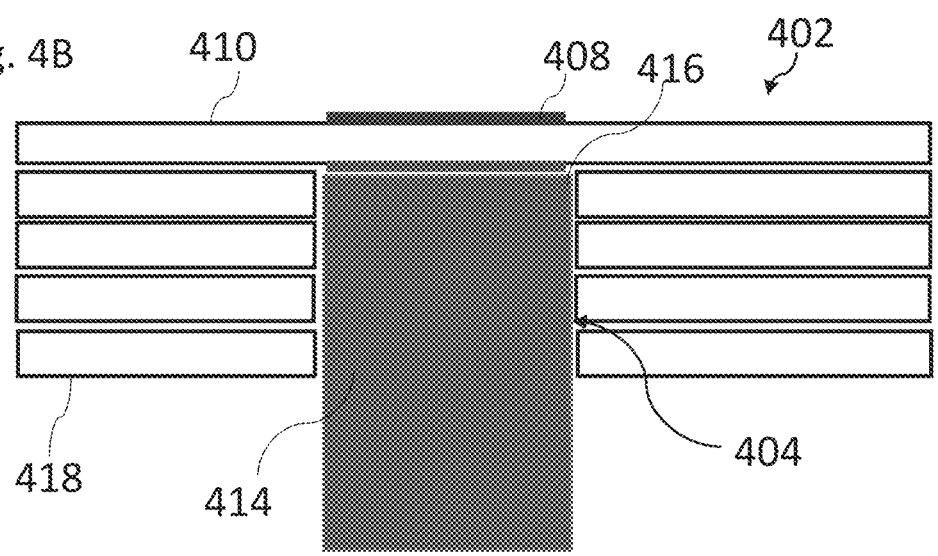
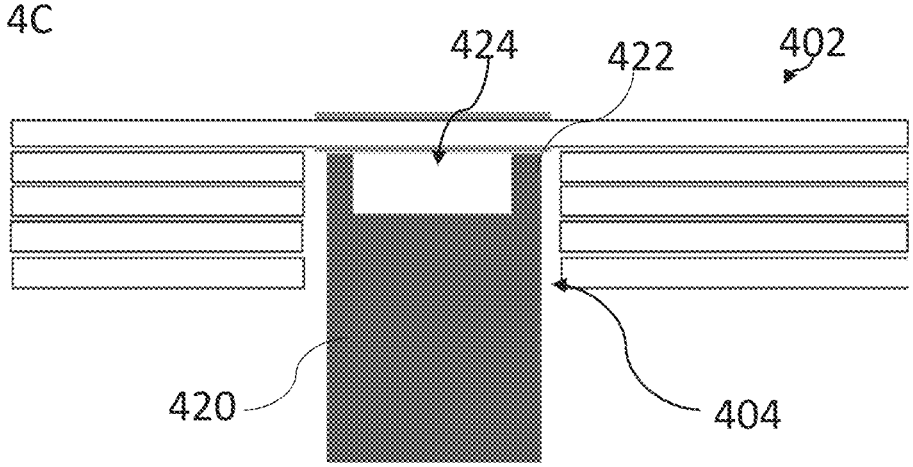

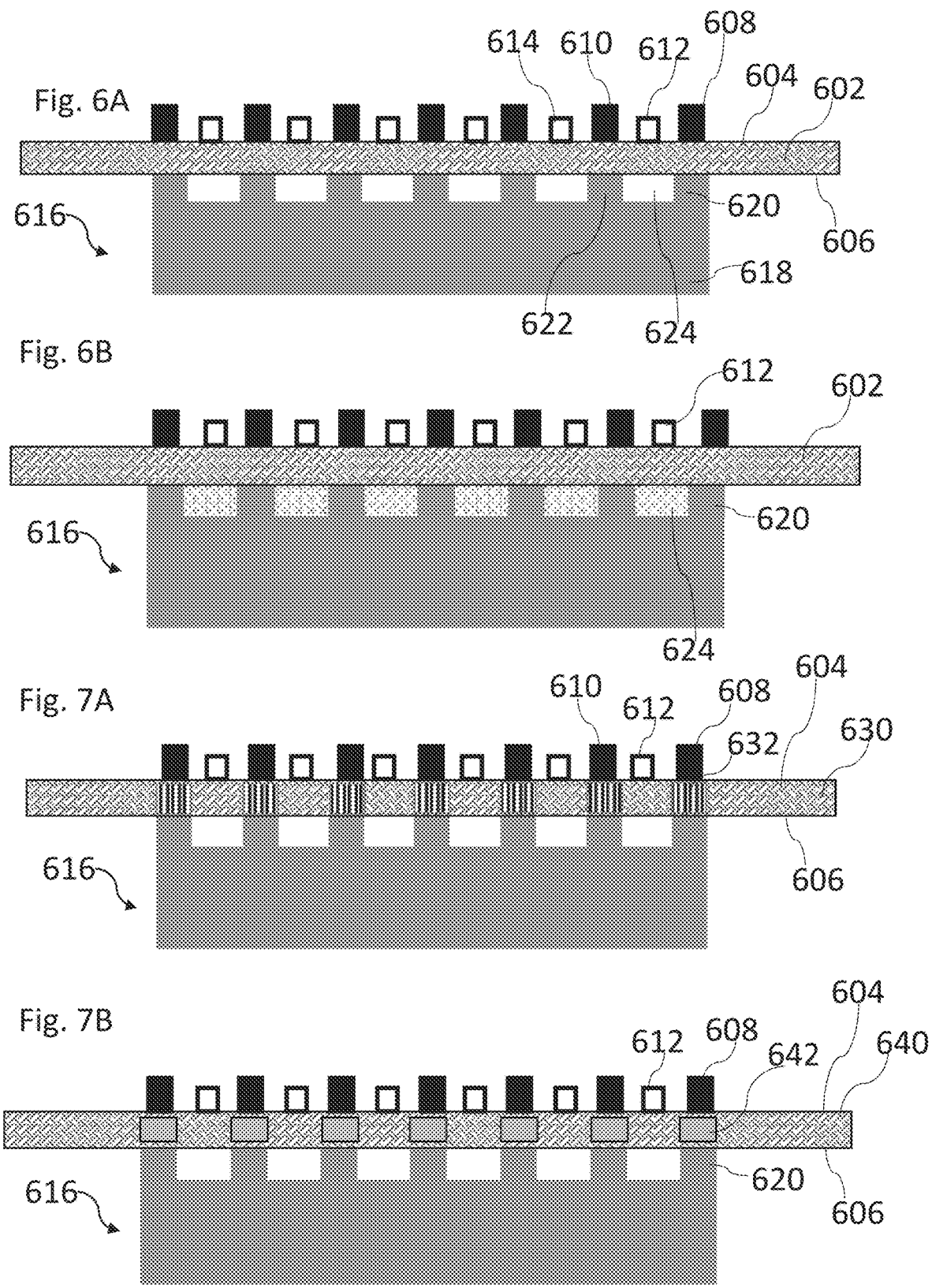

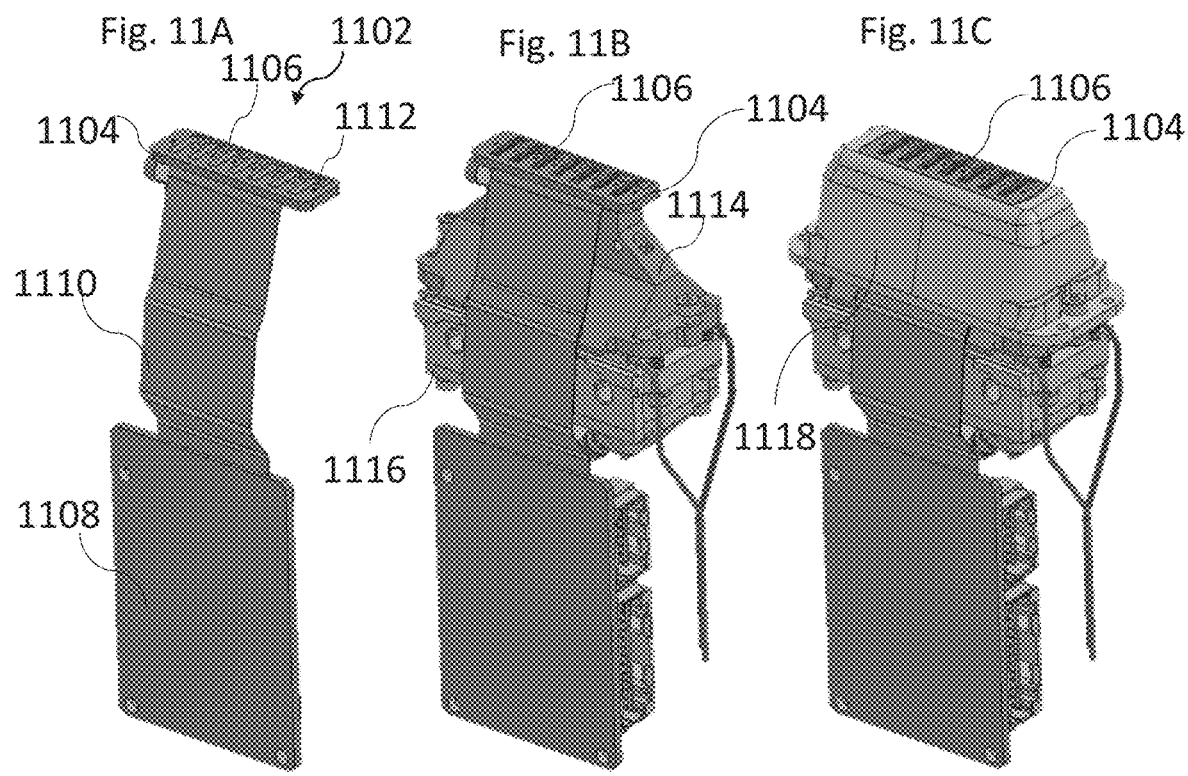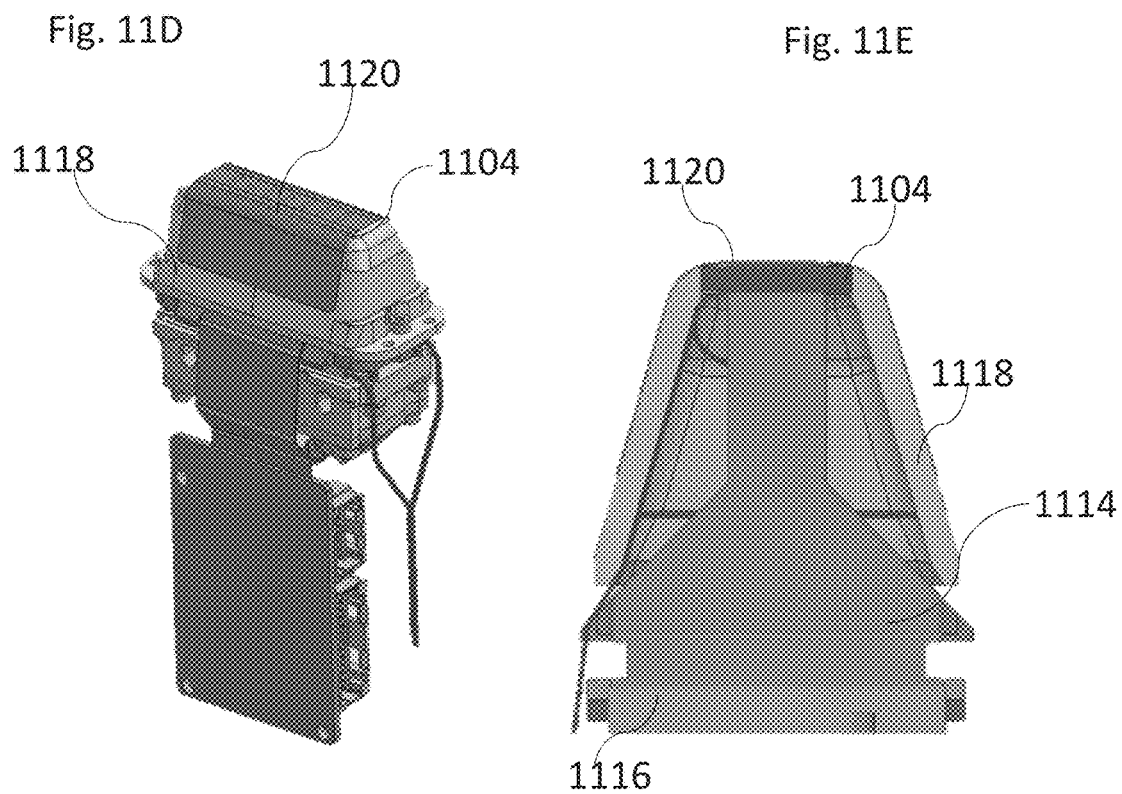

1602

1604

1602

COOLING OF ULTRASOUND ENERGIZERS MOUNTED ON PRINTED CIRCUIT BOARDS

RELATED APPLICATIONS

This application is a continuation of U.S. patent application Ser. No. 18/215,971 filed on Jun. 29, 2023, which is a continuation of PCT Patent Application No. PCT/IL2021/051558 having International Filing Date of Dec. 30, 2021, which claims the benefit of priority under 35 USC § 119(e) of U.S. Provisional Patent Application No. 63/132,629 filed on Dec. 31, 2020. The contents of the above applications are all incorporated by reference as if fully set forth herein in their entirety.

FIELD AND BACKGROUND OF THE INVENTION

The present invention, in some embodiments thereof, relates to an energy transmitting assembly and, more particularly, but not exclusively, to an ultrasound energy transmitting assembly.

SUMMARY OF THE INVENTION

The following describes some examples of embodiments of the invention (an embodiment may include features from more than one example and/or fewer than all features of an example):

Example 1. An assembly comprising:
a printed circuit board (PCB) having a first surface and a second surface;
at least one energy transmitter mounted on said first surface;
at least one cooling element associated with said PCB second surface, wherein said cooling element is configured to cool said at least one energy transmitter via said PCB.

Example 2. An assembly according to example 1, comprising at least one temperature sensor mounted on said first surface of said PCB near said at least one energy-transmitter.

Example 3. An assembly according to example 2, wherein said at least one energy transmitter comprises a plurality of spaced-apart energy transmitter mounted on said first surface of said PCB, and wherein said at least one temperature sensor comprises at least two temperature sensors, wherein a single or at least one temperature sensor of said at least two temperature sensors is mounted between two adjacent energy transmitters on said first surface.

Example 4. An assembly according to any one of examples 2 or 3, wherein said at least one temperature sensor comprises a thermistor.

Example 5. An assembly according to any one of the previous examples, wherein said PCB comprises at least one heat conducting region between said at least one cooling element and said at least one energy transmitter.

Example 6. An assembly according to example 5, wherein said at least one heat conducting region crosses said first surface on which said at least one energy transmitter is mounted.

Example 7. An assembly according to example 5, wherein a PCB region is positioned between said at least one energy transmitter and said at least one heat conducting region.

Example 8. An assembly according to any one of examples 5 to 7, wherein said at least one heat conducting region is aligned with a position of said at least one energy transmitter on said first surface.

Example 9. An assembly according to any one of examples 5 to 8, wherein said at least one heat conducting region comprises an implant of a heat conducting material inside the PCB.

Example 10. An assembly according to any one of examples 5 to 9, wherein said at least one heat conducting region comprises a via channel preformed in the PCB, wherein at least 50% of a volume of said via channel is filled with a heat conducting material.

Example 11. An assembly according to any one of examples 9 or 10, wherein said heat conducting material comprises at least one of Copper, Gold, Silver, Silver Epoxy and Gold Epoxy.

Example 12. An assembly according to any one of the previous examples, wherein said at least one cooling element comprises a flat surface, and wherein said flat surface is at least partly attached to said second surface of said PCB.

Example 13. An assembly according to any one of the previous examples, wherein said PCB comprises at least one cavity with an opening in said second surface, wherein said at least one cavity is aligned with said at least one energy transmitter, and crosses at least partly said PCB, and wherein said cooling element is shaped and sized to penetrate through said opening into said at least one cavity.

Example 14. An assembly according to example 13, wherein said at least one cooling element comprises a heat-conducting holder having at least one protrusion, and wherein said at least one protrusion is shaped and sized to penetrate through said opening into said at least one cavity.

Example 15. An assembly according to any one of examples 1 to 12, wherein said at least one cooling element comprises a heat conducting holder having a flat surface, and wherein said holder flat surface is in contact with said second surface.

Example 16. An assembly according to any one of examples 1 to 11, wherein said at least one cooling element comprises one or more cooling channels passing through said PCB.

Example 17. An assembly according to example 16, wherein said one or more cooling channels comprise at least inlet and/or at least one outlet at said second surface of said PCB.

Example 18. An assembly according to any one of the previous examples, wherein said at least one energy transmitter comprises at least one first electrode and at least one second electrode for delivering electricity from said PCB to said at least one energy transmitter.

Example 19. An assembly according to example 18, wherein said PCB comprises at least one flexible region for electrically connecting said at least one first electrode to a first electrically conducting pad of the PCB, and wherein said at least one second electrode is electrically connected to a second electrically conducting pad of the PCB via an electrically conducting adhesive layer.

Example 20. An assembly according to example 18, wherein said PCB comprises at least two flexible regions, wherein at least one flexible region electrically connects said at least one first electrode to said PCB, and wherein a different flexible region of said at least two flexible regions electrically connects said at least one second electrode to said PCB.

Example 21. An assembly according to example 18, wherein said at least one first electrode is electrically connected by wire welding to a first electrically conducting pad of the PCB and wherein said at least one second electrode is electrically connected to a second electrically conducting pad of the PCB via an electrically conducting adhesive layer.

Example 22. An assembly according to example 18, wherein each of said at least one first electrode and said at least one second electrode is electrically connected to said PCB by a different electrically conducting pad of the PCB, via an electrically conducting adhesive layer.

Example 23. An assembly according to any one of the previous examples wherein said PCB comprises at least one thermal insulating region between said at least one cooling element and at least one region of the first surface adjacent to said at least one energy transmitter.

Example 24. An assembly according to example 23, wherein said at least one thermal insulating region crosses said first surface.

Example 25. An assembly according to example 23, wherein at least one layer of said PCB is positioned between said first surface and said at least one thermal insulating region.

Example 26. An assembly according to example 23, wherein said at least one thermal insulating region is spaced apart from each of said first surface and said second surface of said PCB by at least one layer of said PCB.

Example 27. An assembly according to any one of examples 23 to 26, wherein said at least one thermal insulating region is an opening in the PCB filled with air.

Example 28. An assembly according to any one of examples 23 to 26, wherein said at least one thermal insulating region comprises an implant of a thermal insulating material inside the PCB.

Example 29. An assembly according to any one of examples 23 to 26, wherein said at least one thermal insulating region comprises a via preformed in the PCB filled with a thermal insulating material.

Example 30. An assembly according to any one of examples 28 or 29, wherein said thermal insulating material comprises air or gas or silica particles with air.

Example 31. An assembly according to any one of examples 2 to 4, comprising at least one thermal insulating region between said at least one temperature sensor on said first surface and said at least one cooling element.

Example 32. An assembly according to any one of the previous examples, wherein said at least one energy transmitter comprises at least one of, at least one ultrasound transducer, at least one radiofrequency electrode, and at least one laser diode.

Example 33. An assembly according to example 32, wherein said at least one ultrasound transducer is configured to deliver unfocused ultrasound energy.

Example 34. An assembly according to any one of examples 31 or 32, wherein said at least one ultrasound transducer comprises at least one piezoelectric element.

Example 35. A printed circuit board (PCB), comprising:
a rigid region having a first surface and a second surface, wherein said rigid region comprises one or more cavities crossing through said second surface;
at least one energy transmitter positioned on said first surface, and wherein said one or more cavities is aligned with a position of said at least one energy transmitter.

Example 36. A PCB according to example 35, comprising:
a flexible region electrically and mechanically connected to said rigid region second surface at a distance from an edge of said rigid region.

Example 37. A PCB according to any one of examples 35 or 36, wherein said rigid region comprises at least one heat conducting region between said one or more cavities and said at least one energy transmitter.

Example 38. A PCB according to any one of examples 35 to 37, wherein said at least one energy transmitter comprises a plurality of energy transmitters positioned on the first surface at a distance between each other, and wherein said one or more cavities comprise a plurality of spaced-apart cavities arranged side-by-side within said rigid region, wherein each cavity of said plurality of spaced-apart cavities is aligned with a different energy transmitter of said plurality of energy transmitters.

Example 39. A PCB according to any one of examples 35 to 38, wherein said first surface and/or said second surface are planar.

Example 40. A PCB according to any one of examples 35 to 39, wherein said one or more cavities is shaped and sized to receive at least one cooling element.

Example 41. An ultrasound applicator comprising:
at least one energy emitting assembly, comprising:
a printed circuit board (PCB) having a first surface and a second surface;
at least one ultrasound transducer mounted on said first surface;
at least one rigid cover having an opening and configured to geometrically interlock with said PCB,
wherein said at least one ultrasound transducer and said PCB first surface are at least partly exposed via said opening of said at least one rigid cover.

Example 42. An applicator according to example 41, wherein said PCB comprises at least one recess, and wherein said at least one rigid cover geometrically interlocks with said at least one recess.

Example 43. An applicator according to any one of examples 41 or 42, wherein said at least one energy emitting assembly comprises at least one cooling element associated with said PCB second surface, wherein said at least one cooling element is configured to cool said at least one ultrasound transducer via said PCB.

Example 44. An applicator according to any one of examples 41 to 43, comprising at least one insulating layer attached to said cover distally to said opening, wherein said at least one insulating layer electrically isolates said at least one energy emitting assembly and seals the at least one energy emitting assembly from penetration of humidity and liquids.

Example 45. A method for cooling an energy transmitter, comprising:
providing at least one energy transmitter mounted on a surface of a printed circuit board (PCB); cooling said at least one energy transmitter and/or said surface via said PCB.

Example 46. A method according to example 45, wherein said cooling comprises cooling said at least one energy transmitter and/or said surface by at least one cooling element penetrating at least partly into said PCB via a different surface of said PCB.

Example 47. A method according to any one of examples 45 or 46, wherein said providing comprises providing at least one ultrasound transducer mounted on said surface, and wherein said cooling comprises cooling said at least one ultrasound transducer and/or said surface via said PCB.

Example 48. A method according to example 47, comprising activating said at least one ultrasound transducer to generate and deliver unfocused ultrasound energy to a skin tissue during said cooling.

Example 49. A method for manufacturing an energy transmitting assembly, comprising: providing a rigid printed circuit board (PCB) having electrical wiring, a first surface and a second surface;

and mounting at least two ultrasound transducers on said first surface at a distance from each other.

Example 50. A method according to example 49, comprising forming at least two cavities in said PCB, wherein each cavity has an opening in said second surface.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is a schematic illustration of an energy transmitting assembly which includes at least one energy transmitter positioned on a surface of a PCB, according to some exemplary embodiments of the invention;

FIG. 2 is a general flow chart for cooling at least one energy transmitter via the PCB, according to some exemplary embodiments of the invention;

FIGS. 3B-3E are schematic illustrations of a PCB within an applicator body, according to some exemplary embodiments of the invention;

FIG. 3F is a schematic illustration of a connection between a flexible region and a rigid region of a PCB, according to some exemplary embodiments of the invention;

FIGS. 4A-4G are schematic illustrations of a PCB with at least one cavity, according to some exemplary embodiments of the invention;

FIGS. 6A-6B are schematic illustrations showing a PCB having a flat surface placed on top of a holder extensions, according to some exemplary embodiments of the invention;

FIGS. 7A-7C are schematic illustrations of a PCB having at least one heat conducting region and/or at least one thermal insulating region, positioned on a holder extensions, according to some exemplary embodiments of the invention;

FIGS. 11A-11F are schematic illustrations of an assembly process of an applicator head comprising a PCB with energy transmitters mounted on a PCB surface, according to some exemplary embodiments of the invention;

DESCRIPTION OF SPECIFIC EMBODIMENTS OF THE INVENTION

Figure 3A:
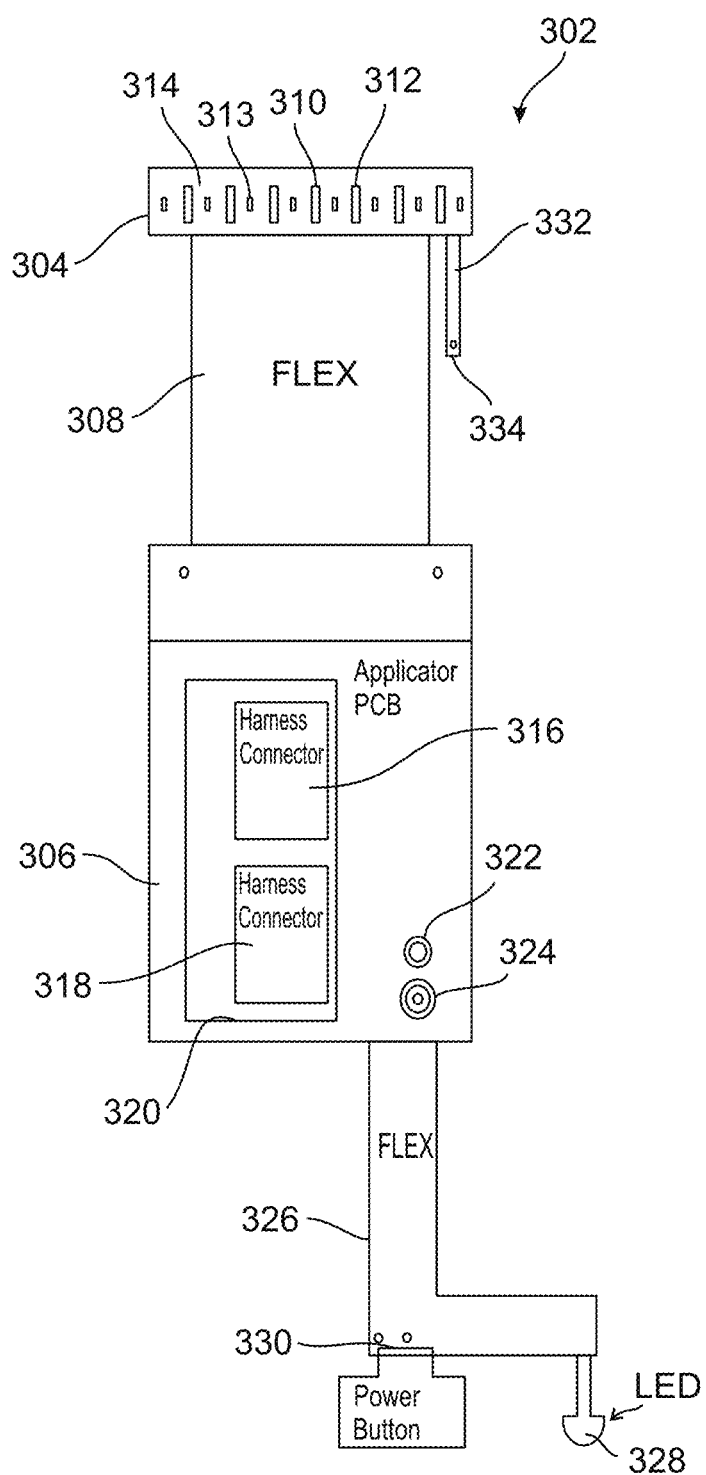
FIG. 3A is a schematic illustration of a PCB, according to some exemplary embodiments of the invention.

The present invention, in some embodiments thereof, relates to an energy transmitting assembly and, more particularly, but not exclusively, to an ultrasound energy transmitting assembly.

Overview

An aspect of some embodiments relates to an energy transmitting assembly which includes one or more energy transmitters mounted on a circuit board, for example a printed circuit board (PCB), and cooling of the one or more energy transmitters via the circuit board. In some embodiments, the one or more energy transmitters are mounted on a flexible region of the PCB, for example a flexible PCB, and/or on a rigid region of the PCB, for example a rigid PCB. In some embodiments, the one or more energy transmitters comprise one or more energy transducers, for example one or more ultrasound transducers. In some embodiments, the one or more energy transmitters are mounted on a first surface of the circuit board, and the cooling is applied via a second surface of the circuit board. Alternatively or additionally, the cooling is applied from within the circuit board. In some embodiments, the circuit board comprises electrical wiring, configured to deliver electric power to the one or more energy transmitters and to electrically connect the one or more energy transmitters with a power source and/or a control circuitry.

According to some embodiments, cooling is provided by at least one cooling element associated with the second surface of the PCB. In some embodiments, the cooling element is attached to the second surface of the PCB, and heat is conducted from the one or more energy transmitters to the cooling element via the second surface of the PCB. Alternatively, heat is conducted from the one or more energy transmitters to a cooling element positioned within the PCB.

According to some embodiments, the cooling element positioned within the PCB comprises at least one finger of a heat-conducting holder attached to the second surface of the PCB. In some embodiments, the at least one finger penetrates into the PCB. Optionally, the at least one finger, for example a long axis of at least one finger is aligned with a location of an energy transmitter mounted on the first surface. Alternatively, the cooling element positioned within the PCB comprises at least one channel shaped and sized to allow coolant fluid flow within the PCB.

According to some embodiments, the PCB comprises one or more heat conducting inserts between at least some of the energy transmitters or each of the energy transmitters and the cooling element. In some embodiments, the heat conducting inserts are formed from a heat conducting material, and are optionally shaped and sized to conduct heat only from the energy transmitters to the cooling element.

According to some embodiments, the energy emitting assembly comprises one or more sensors mounted on the first surface of the circuit board, for example the PCB. In some embodiments, the one or more sensors are positioned between adjacent energy transmitters. In some embodiments, the one or more sensors comprise a plurality of sensors and each of the plurality of sensors is positioned between two adjacent energy transmitters at the first surface of the circuit board. In some embodiments, the one or more sensors comprise at least one temperature sensor, for example a thermistor. Alternatively, or additionally, the one or more sensors comprise at least one pressure sensor.

According to some embodiments, the circuit board comprises one or more heat isolating regions, between the one or more sensors and the at least one cooling element. In some embodiments, the one or more isolating regions comprise an isolating material configured to thermally isolate the one or more sensors from the cooling module, for example air, Nitrogen gas, gas filled small polymer particles, gas filled small silica particles, and glass fibers.

According to some embodiments, the one or more energy transmitters comprise a single type of energy transmitting, for example ultrasound transducers. Alternatively, the one or more energy transmitters comprise a mic of two or more types of energy transmitters arranged at the first surface of the circuit board.

A potential advantage of mounting one or more energy transmitters on a circuit board, and most importantly in a planar geometry, may be to allow easy assembly and/or mass production of an energy transmitting assembly, for example using a pick and place method and/or machine, which are very common and standard in the PCB manufacturing industry.

An aspect of some embodiments relates to controlling heat conductivity via a PCB, using at least one heat conducting region within the PCB. In some embodiments, at least one heat conducting region is positioned between at least one cooling element associated with the PCB and a surface of the PCB on which at least one energy transmitter is mounted. In some embodiments, the heat conducting region is configured to increase heat conductivity between the energy transmitter and the cooling element, which optionally allows efficient cooling of the energy transmitter by the cooling element. In some embodiments, the heat conducting region is selectively positioned within the PCB, for example according to a position or a planned position of a heat generating element, for example an energy transmitter.

In some embodiments, at least one heat conducing region in a PCB is a region that conducts heat with more than 20%, for example more than 40%, more than 50%, more than 60%, more than 80% or any intermediate, smaller or larger percentage value, of a heat conducting efficiency compared to other regions of the PCB.

According to some embodiments, the heat conducting region is positioned between a first surface of the PCB on which the energy transmitter is mounted, and a second surface associated with the cooling element. In some embodiments, the heat conducting region comprises a channel, for example a VIA channel filled with a heat conducting material, having an opening in the second surface. In some embodiments, at least 50% of the VIA channel, for example at least 70%, at least 80%, at least 90%, at least 95% of the VIA channel is filled with the heat conducting material. In some embodiments, a portion of the PCB is positioned between the VIA channel and the first surface of the PCB, for example to allow electric isolation between an energy transmitter mounted on the first surface and the heat conducting material within the VIA channel. Alternatively, the VIA channel crosses through the first surface and the second surface of the PCB.

According to some embodiments, the heat conducting region comprises an implant, for example an insert positioned within the PCB. In some embodiments, the implant comprises a heat conducting material. In some embodiments, a portion of the PCB separates between the implant and the first surface on which the transducer is mounted. Additionally or optionally, a portion of the PCB separates between the second surface of the PCB and the implant. Alternatively, the implant crosses through the second surface and/or the first surface of the PCB.

According to some embodiments, the PCB comprises at least one thermally isolated region. In some embodiments, a thermally isolated region in a PCB is a region that conducts heat with less than 20%, for example less than 40%, less than 50%, less than 60%, less than 80% or any intermediate, smaller or larger percentage value, of a heat conducting efficiency compared to other regions of the PCB.

According to some embodiments, the at least one thermally isolated region is positioned between a second surface of the PCB and/or a cooling element, and a region of the first surface which is adjacent or near an energy transmitter. Optionally, the at least one thermally isolated region is positioned between a second surface of the PCB and/or a cooling element, and a region of the first surface which is positioned between two adjacent energy transmitter, for example to prevent over cooling of the first surface which optionally contacts tissue.

According to some embodiments, a position of the at least one thermally isolated region is determined according to a location of an energy transmitter and/or a location of at least one sensor, for example a temperature sensor, on a surface of the PCB. In some embodiments, the at least one thermally isolated region is selectively positioned between the at least one sensor and at least one cooling element. In some embodiments, a position of the thermally isolated region is aligned with a region on the first surface between two adjacent energy transmitters and/or with a position of a sensor on the first surface.

According to some embodiments, the at least one thermally isolated region is in contact with a surface on which the at least one sensor is positioned and/or in contact with the at least one cooling element. Alternatively, the at least one thermally isolated region is spaced-apart from a surface on which the at least one sensor is positioned and/or is spaced-apart from the at least one cooling element.

According to some exemplary embodiments, the at least one thermally isolated region crosses through the first surface and/or the second surface of the PCB. In some embodiments, a portion of the PCB separates between the at least one thermally isolated region and the first surface and/or the second surface of the PCB. In some embodiments, the at least one thermally isolated region comprises a VIA channel filled with a thermally isolating material. In some embodiments, the at least one thermally isolated region comprises an implant of a thermally isolating material.

A potential advantage of a PCB with at least one specific thermally isolated region within the PCB body may be to control or limit a thermal effect via the PCB body on thermally sensitive elements, for example at least one temperature sensor mounted on a surface of the PZT.

A potential advantage of having heat-conductive regions and/or thermal insulating regions, may be to control distribution of a cooling effect from at least one cooling element through the PCB layers. The thermal isolation regions in the PCB allow the cooling to be aligned with a location of an energy transmitters, for example a piezoelectric element (PZT), and/or to be localized to a region in the PCB beneath and/or near the PZT. This may prevent cooling of PCB regions without PZT, that touch the skin.

Controlling of the cooling effect is important, for example to prevent too much cooling of the skin, which may decrease or even prevent a desired thermal effect generated by the PZT elements, in the tissue.

An additional potential advantage of the thermal isolation regions may be to isolate the thermistors from the cooling effect, for example to allow the thermistors to be highly responsive to heat flow from the skin.

The assembly and applicator described herein are configured to allow measurements of the skin temperature in direct contact and relatively very close to a location on the skin surface through which the energy is applied.

An aspect of some embodiments relates to a PCB, for example a rigid region of a PCB, having a first surface which comprises at least one energy transmitter and at least one cavity which is aligned with a position of the energy transmitter on the first surface. In some embodiments, the cavity has an opening in a second surface of the PCB, which optionally an opposite surface to the first surface. In some embodiments, a flexible region is electrically and mechanically coupled to the rigid region at a distance from an end of the rigid region. Optionally, the flexible region electrically and mechanically connects the rigid region which comprises the at least one energy transmitter, with at least one different rigid region.

According to some embodiments, the rigid region comprises a plurality of spaced-apart energy transmitters, for example ultrasound transducers, mounted on the first surface, at a distance from each other. In some embodiments, the rigid region comprises a plurality of spaced-apart cavities selectively positioned within the PCB according to a distribution of the energy transmitters on the first surface. In some embodiments, each cavity is aligned with a position of an energy transmitter on the first surface. In some embodiments, a portion of the PCB separates between each cavity and the first surface. In some embodiments, a portion of the PCB between each cavity and a first surface of the PCB has a thickness value in a range between 50 μm-300 μm, for example 50 μm-100 μm, 70 μm-200 μm, 100 μm-200 μm, 150 μm-300 μm or any intermediate, smaller or larger range of values.

In some embodiments, at least one or each surface of the first surface and the second of the PCB are planar.

According to some embodiments, the rigid region of the PCB comprises at least one heat conducting region between the cavity and the first surface. In some embodiments, the heat conducting region is separated from the cavity and/or from the first surface by a portion of the PCB.

An aspect of some embodiments relates to an ultrasound applicator which comprises a PCB with at least one energy transmitter mounted on a surface of the PCB, and a cover, for example a rigid cover, that is configured to geometrically interlock with the PCB. In some embodiments, the cover comprises an opening. In some embodiments, when the cover interlocks with the PCB the at least one energy transmitter is exposed via the cover opening. In some embodiments, the ultrasound applicator comprises at least one insulating layer attached to the cover for example on top the cover opening. In some embodiments, the at least one insulating layer seals the PCB and/or the at least one energy transmitter from humidity and/or liquids.

According to some embodiments, the PCB comprises at least one recess, for example a recess positioned laterally from a location of the at least one energy transmitter on the PCB. In some embodiments, the cover is configured to geometrically interlock, for example to contact, the at least one recess. In some embodiments, the at least one recess is a recess in the surface on which the at least one energy transmitter is mounted. Alternatively, the at least one recess is a recess in a different surface of the PCB, for example a surface which is opposite to the surface on which the energy transmitter is mounted.

An aspect of some embodiments relates to a method for manufacturing of an energy transmitting assembly by mounting at least one energy transmitter, for example an ultrasound transducer on a surface of a PCB. In some embodiments, a plurality of energy transmitters are mounted on a surface of the PCB at distance from each other, for example using a pick and place process. In some embodiments, a distance, for example a minimal distance, between two adjacent energy transmitters on the PCB is in a range of 0.1 mm-100 mm, for example, 0.5 mm-20 mm, 1 mm-10 mm, or any intermediate, smaller or larger range of values. In some embodiments, a distance, for example a minimal distance between two adjacent energy transmitters on the PCB is 1 mm, 1.5 mm, 2 mm, 2.5 mm, 3 mm, 3.5 mm, 4 mm or any intermediate, smaller or larger distance. In some embodiments, at least some or all of the energy transmitters are positioned in parallel. Alternatively or optionally, at least some of the energy transmitters are oriented in an angle or at a different orientation relative to adjacent energy transmitters. Alternatively or optionally a distance between adjacent energy transmitters is similar or varies between energy transmitters on the PCB.

According to some embodiments, during the manufacturing process one or more cavities are formed in the PCB, for example according to a planned position of the at least one energy transmitter. In some embodiments, the one or more cavities have an opening in a surface of the PCB which is different and optionally opposite to a surface on which the at least one energy transmitter is mounted or is planned to be mounted. In some embodiments, a portion of the PCB separates between the cavity and a planned location of the at least one energy transmitter on the PCB.

According to some embodiments, the cavity is formed by drilling through the PCB. Alternatively, the cavity is formed by stacking PCB layers each having an opening in a planned location of the cavity. In some embodiments, each cavity is aligned with a planned position or with a location of an energy transmitter on the PCB surface. In some embodiments, the cavity is formed with dimensions selected to allow penetration of at least one heating element, for example an extension of a heat-conducting holder, into the cavity.

According to some embodiments, during the manufacturing process, at least one heat conducting region is formed in the PCB. In some embodiments, the at least one heat conducting region is formed between a surface of the PCB on which at least one energy transmitter is planned to be mounted, and a second surface of the PCB. Alternatively, the at least one heat conducting region is formed between a surface of the PCB on which at least one energy transmitter is planned to be mounted and a cavity or a planned location of a cavity in the PCB.

According to some embodiments, the at least one heat conducting region is formed by placing or introducing a heat conducting implant into the PCB, for example into a void or an opening formed in the PCB. Alternatively, the heat conducting region is formed by generating a via channel in the PCB and filling the via channel with a heat conducting material.

According to some embodiments, the manufacturing process comprises mounting at least one sensor, for example a temperature sensor on top the surface on which the at least one energy transmitter is mounted. In some embodiments, the temperature sensor is mounted between two adjacent energy transmitters. In some embodiments, the temperature sensor is mounted using a pick and place process.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Exemplary Energy Transmitting Assembly

According to some exemplary embodiments, at least one energy transmitter is used to deliver energy to tissue of the body, for example during a medical treatment or a cosmetic treatment. In some embodiments, the at least one energy transmitter comprises a transducer, for example an ultrasound transducer. Optionally, the ultrasound transducer comprises a piezoelectric ceramic material, for example Lead Zirconate Titanate, Barium Titanate, or other materials exhibiting piezoelectric behaviors. Alternatively or additionally, the at least one energy transmitter comprises at least one of a radiofrequency (RF) electrode and/or a laser diode.

According to some exemplary embodiments, the at least one energy transmitter is part of an energy transmitting assembly, which comprises an electric circuitry and a cooling element, for example a cooler, configured to cool the at least one energy transmitter and/or the tissue of the body, before, during and/or after the activation of the at least one energy transmitter. Reference is now made to FIG. 1, depicting an energy emitting assembly, according to some exemplary embodiments of the invention.

According to some exemplary embodiments, an energy-transmitting assembly, for example assembly 102, comprises a circuit board, for example PCB 104 having a first surface 106, and at least one additional surface, for example a second surface 108. In some embodiments, the second surface 108 is opposite to the first surface 106.

According to some exemplary embodiments, the assembly 102 comprises at least one energy transmitter, for example at least two energy transmitters 110 and 112 mounted on the first surface 106. In some embodiments, the at least two energy transmitters 110 and 112 are attached to the first surface 106 or are embedded in the first surface 106. In some embodiments, the at least two energy transmitter 110 and 112 are spaced apart, for example distributed on the first surface 106.

According to some exemplary embodiments, the assembly 102 comprises at least one cooling element 114, for example at least one cooler, associated with the second surface 108 of the PCB 104. In some embodiments, the at least one cooling element comprise at least one of a thermoelectric cooler (TEC), a heat-conducting holder, a heat sink, and a coolant fluid or coolant fluid channels passing through the PCB 104 or placed in contact with the PCB 104. In some embodiments, the at least one cooling element comprises a passive cooling element and/or an active cooling element.

According to some exemplary embodiments, the cooling element 114 is at least partly attached to the second surface 108. In some embodiments, the cooling element 114 is at least partly in contact with the second surface 108. Alternatively or additionally, the cooling element 114 penetrates at least partly into the PCB 104, optionally through the second surface 108. In some embodiments, a penetration region of the cooling element 114 into the PCB 104 is aligned with a location of at least one energy transmitter on the first surface 106 of the PCB 104.

According to some exemplary embodiments, the assembly 102 comprises at least one sensor, for example at least two sensors 116 and 118, mounted on top the first surface 106 of the PCB 104. In some embodiments, the at least one sensor comprises a temperature sensor, for example a thermistor. In some embodiments, the at least one sensor is attached to the first surface 106. In some embodiments, the at least one sensor is positioned between two adjacent energy transmitter, for example energy transmitters 110 and 112. In some embodiments, each sensor of the at least two sensors 116 and 118 is positioned between a pair of adjacent energy transmitters, on the first surface 106.

According to some exemplary embodiments, the assembly 102 comprises at least one heat-conducting region in the PCB, optionally between the cooling element 114 and the at least one energy transmitter, for example to increase heat conduction through the PCB from the at least one energy transmitter and the cooling module. In some embodiments, the assembly 102 comprises at least one thermally-isolating region within the PCB, optionally, between the at least one sensor, for example a temperature sensor, and the cooling element, for example to reduce interference to heat measurements by the at least one temperature sensor from the cooling module 114.

According to some exemplary embodiments, the assembly 102 is part of an energy transmitting applicator, optionally used in medical and/or cosmetic procedures. In some embodiments, the assembly 102 is placed within a head of the applicator, such that the first surface 106 is oriented to face a body tissue. In some embodiments, the first surface 106 is configured to be placed in direct or indirect contact with the tissue, for example with the skin. In some embodiments, the first surface 106 is adjacent to a skin contacting surface of the applicator. Optionally, the skin contacting surface of the applicator is positioned between the tissue, for example the skin or the skin surface, and the first surface 106 comprising the at least one energy transmitter.

Exemplary Process for Cooling Transmitters

According to some exemplary embodiments, a device for delivery of energy to a tissue, for example an applicator, comprises one or energy transmitters, for example energy-emitting transducers. In some embodiments, the one or more energy transmitters are mounted on a surface of a circuit board, for example a PCB, and are positioned inside the applicator to face a skin contacting surface of the applicator. In some embodiments, during the activation of the one or more energy transmitters, heat is generated and delivered to a tissue, for example skin, contacting the applicator's skin contacting surface. In some embodiments, in order to prevent thermal damage to the tissue, the skin contacting surface of the applicator and/or at least one of the energy transmitters is cooled.

Reference is now made to FIG. 2, depicting a method for cooling at least one energy transmitter of an applicator, according to some exemplary embodiments of the invention.

According to some exemplary embodiments, an applicator with at least one energy transmitter is provided at block 202. In some embodiments, the applicator comprises a surface that is shaped and sized to be placed in contact with tissue, for example with a skin. In some embodiments, the applicator is mounted on a surface of a PCB placed adjacent to the skin contacting surface of the applicator. In some embodiments, the at least one energy transmitter is positioned between the skin contacting surface of the applicator and the PCB.

According to some exemplary embodiments, the applicator is optionally placed in contact with the skin, at block 204. In some embodiments, at least a portion of the skin contacting surface of the applicator is placed in contact with the skin.

According to some exemplary embodiments, the at least one energy transmitter is activated at block 206. In some embodiments, activating the at least one energy transmitter generates and delivers energy from the at least one energy transmitter to the tissue. In some embodiments, the at least one energy transmitter comprises an ultrasound transducer. In some embodiments, activation of the ultrasound transducer generates and delivers ultrasound energy, for example unfocused ultrasound energy, into tissue layers of the skin, for example into deep tissue layers of the skin. In some embodiments, activation of the at least one energy transmitter generates heat by the transmitter, that may lead to thermal damage of the tissue contacting the applicator.

According to some exemplary embodiments, cooling of the at least one energy transmitter is applied through the PCB, at block 208. In some embodiments, cooling is applied through one or more layers of the PCB structure. In some embodiments, cooling is applied through the one or more layers of the PCB to the at least one energy transmitter mounter on the PCB surface. In some embodiments, the cooling is applied through one or more surfaces of the PCB, for example one or more surfaces that are opposite to the surface on which the at least one energy transmitter is mounted. In some embodiments, the cooling is applied at block 208 before, during and/or after the activating at block 208. In some embodiments, the cooling is applied via the PCB and the at least one energy transmitter to cool the tissue contacting the applicator and/or the at least one energy transmitter.

Exemplary General PCB

According to some exemplary embodiments, a PCB comprises at least one flexible region and at least one rigid region. Optionally, at least one flexible region of the PCB interconnects two rigid regions of the PCB, forming for example a PCB body formed from flexible and rigid regions connected to each other. In some embodiments, the at least one rigid region of the PCB is used as a base for connecting the at least one energy transmitter and/or the at least one sensor to the PCB. Additionally or alternatively, the at least one region is used as a base for one or more electric connectors between the PCB and electrical wiring from other features of an energy transmitting applicator or system.

Reference is now made to FIGS. 3A-F, depicting a PCB having flexible and rigid regions, according to some exemplary embodiments of the invention.

According to some exemplary embodiments, a PCB 302 comprises at least one first rigid region 304 and at least one second rigid region 306, interconnected by at least one flexible region 308. In some embodiments, a flexible region of the PCB, for example the flexible region 308 is thin and formed from a flexible material allowing bending in at least 45 degrees, for example at least 90 degrees, at least 180 degrees, or any intermediate, smaller or larger angle without damaging electrical wiring in the flexible region and/or structure of the flexible region.

According to some exemplary embodiments, the energy transmitter is positioned on a flexible PCB. In some embodiments, a thermal conducting region, optionally comprising a thermal conductive implant positioned in the flexible PCB adjacent and/or aligned with the energy transmitter, optionally beneath the energy transmitter, is used to mechanically support the energy transmitter, for example to prevent damage to the energy transmitter when the flexible PCB bends. Alternatively, the energy transmitter is positioned on the flexible PCB with no additional mechanical support.

According to some exemplary embodiments, the at least one first rigid region 304 comprises at least one, for example at least two energy transmitters 310 and 312, mounted on a first surface of the rigid region 304. In some embodiments, the at least one two energy transmitters comprise at least two ultrasound transducers, optionally comprising PZT. In some embodiments, the at least one first rigid region 304 comprises at least one sensor, for example a temperature sensor mounted on the first surface of the rigid region 304. In some embodiments, the at least one temperature sensor comprises a thermistor, for example thermistors 312 and 314. In some embodiments, each of the thermistors is positioned between two adjacent energy transmitters.

According to some exemplary embodiments, the at least one second rigid region 306 comprise at least one electrical connector, for example electrical connectors 316 and 318. In some embodiments, the electrical connectors are configured to electrically connect the PCB 302 to one or more external electrical networks. In some embodiments, the at least one electrical connectors, for example connectors 316 and 318 are surrounded by a barrier 320, forming an isolated region of the connectors 316 and 318. In some embodiments, the barrier separates the electrical connectors from other parts of the second rigid region, for example to allow selective sealing of the isolated region which includes the connectors, using a sealing liquid or a sealing gel.

According to some exemplary embodiments, the at least one second rigid region 306 comprises at least one indicator, for example indicators 322 and 324 configured to generate a human detectable indication, for example an audio and/or a visual indication. In some embodiments, the at least one indicator generates an indication when an electrical connection is established between the PCB 302 and external elements via the at least one electric connector, for example connectors 316 and 318. Alternatively or additionally, the at least one indicator generates an indication when the at least one energy transmitter, for example transmitters 310 and 312 are activated.

According to some exemplary embodiments, the PCB 302 comprises at least one additional flexible region, for example flexible region 326 coupled to the at least one second rigid region 306. In some embodiments, the flexible region comprises electrical wiring, electrically connected to electrical wiring of the rigid region 308 and/or the rigid region 304. In some embodiments, the flexible region 326 comprises at least one indicator, for example indicator 328 configured to generate at least one human detectable indication, for example an audio and/or a visual indication. Alternatively or additionally, the flexible region 326 comprises at least one user interface 330 for receiving at least one user input signal. In some embodiments, the at least one user interface 330 comprises a switch, a selector and/or a button, for receiving the user input. In some embodiments, the at least one user interface 330 is positioned in at least one of a rigid and a flexible region of the PCB 302.

According to some exemplary embodiments, the PCB 302 comprises at least one flexible region, for example a flexible strip 332 coupled to the rigid region 304. In some embodiments, the flexible strip comprises at least one temperature sensor, for example a thermistor 334 electrically connected to the wiring within the flexible strip 332.

According to some exemplary embodiments, when positioned within an applicator body, flexible regions of the PCB 302 allow placing the rigid regions at different positions and/or orientation relative to each other, and relative to other elements within the applicator body. For example, the flexible strip 332 allows to place the thermistor 334 in contact with one or more elements that are located close to the rigid region 304, for example with one or more cooling elements.

According to some exemplary embodiments, the PCB 302 which comprises flexible and rigid regions is used as an electrical hub of the applicator body, for example to allow connection of electrical components to a central electrical wiring of the PCB 302, while allowing a mechanically flexible interface between the electrical components coupled to the PCB 302 and other components within the applicator body, for example other electrical and/or non-electrical components.

According to some exemplary embodiments, for example as shown in FIGS. 3B and 3C, the PCB is placed within an applicator body which comprises a cover, for example cover 311, configured to prevent contact between tissue and the PCB or with other components within the applicator body. In some embodiments, a rigid region of the PCB, for example region 304 comprising the energy transmitters 312 and 314 is placed in contact with the cover 311.

According to some exemplary embodiments, for example as shown in FIG. 3D. the applicator body comprises at least one cooling element, for example holder 340, that is placed in contact with the PCB, for example with a rigid region 304 comprising the energy transmitters, for example energy transmitter 310. In some embodiments, the holder 340 is a heat-conductive holder, which optionally also provides mechanical support to the PCB. In some embodiments, the holder 340 is used as a base for the rigid region 304 of the PCB. In some embodiments, the holder 340 contacts a surface of the PCB which is opposite to the surface and/or is different from the surface on which the transmitter 310 is mounted.

According to some exemplary embodiments, for example as shown in FIG. 3D, a cover 344 of the applicator body covers at least part of the PCB rigid region, on which the transmitter 310 is mounted, without covering the transmitter 310. In some embodiments, for example as shown in FIG. 3D, the cover 344 is coupled to a PCB surface comprising the transmitter 310. Alternatively, for example as shown in FIG. 3E, the cover of the applicator body, for example cover 346 is coupled to a surface of the PCB which is opposite to the side of the PCB comprising the transmitter 310. In some embodiments, for example as shown in FIG. 3E, the PCB rigid region 305 is used as part of the applicator body cover.

According to some exemplary embodiments, for example as shown in FIGS. 3D and 3E, the cover 344 geometrically interlocks with the PCB, for example with rigid region 304 of the PCB. In some embodiments, for example as shown in FIG. 3D, the rigid region 304 comprises at least one distal recess, for example a lateral distal recess, which is closer to a surface of the PCB on which the transmitter 310 is mounted. In some embodiments, the cover 344 geometrically interlocks with the at least one distal recess.

According to some exemplary embodiments, for example as shown in FIG. 3E, the rigid region 304 comprises at least one proximal recess 313, for example a lateral proximal recess, which is closer to a surface of the PCB facing the at least one cooling element, for example holder 340. In some embodiments, the cover 346 geometrically interlocks with the at least one proximal recess 313.

According to some exemplary embodiments, for example as shown in FIG. 3F, a flexible region 308 is coupled, for example mechanically and electrically coupled, to a rigid region 304 at a distance from an end 305, for example an edge, of the rigid region 304. A potential advantage of the coupling of the flexible region to the rigid region at a distance from an edge of the distal region may be to allow tension release when bending the flexible region relative to the rigid region, for example when adjusting the shape and/or a size of the PCB to be placed within an applicator body.

Exemplary PCB with Cavities

According to some exemplary embodiments, during the activation of at least one energy transmitter mounted on a PCB, for example an ultrasound transducer, heat is generated by the at least one energy transmitter. In some embodiments, the generated heat may cause thermal damage to tissue located adjacent to the energy transmitter or that is placed in direct or indirect contact with the energy transmitter. In some embodiments, cooling of the at least one energy transmitter, is performed using at least one cooling element which is associated with the PCB, for example via a surface of the PCB that is different from the surface on which the at least one energy transmitter is mounted.

According to some exemplary embodiments, the PCB is formed with one or more cavities that allow, for example, penetration of the at least one cooling element into the PCB. In some embodiments, the one or more cavities are aligned with a location of the at least one energy transmitter on the surface of the PCB. Reference is now made to FIGS. 4A-4G, depicting a PCB with cavities that are shaped and sized to receive at least part of a cooling element, according to some exemplary embodiments of the invention.

According to some exemplary embodiments, for example as shown in FIG. 4A, a PCB 402 has a thickness 406 in a range between 0.5 mm-3 mm, for example 0.5 mm-2 mm, 1 mm-2 mm, 1.5 mm-3 mm or any intermediate, smaller or larger range of values. Optionally, the PCB 402 is formed from layers, for example 3, 4, 5, 6, 7 layers or any larger number of layers.

According to some exemplary embodiments, the PCB comprises at least one cavity 404. In some embodiments, the cavity 404 penetrates through one or more layers of the PCB 402. In some embodiments, the cavity 404, for example the cavity long axis, is aligned with a pad 408 for placement of an energy transmitter, attached to a first surface 410 of the PCB 402. In some embodiments, a thickness 412 of the PCB between the cavity 404 and the pad 408, or between the cavity 404 and the PCB surface 410 is in a range between 0.05 mm-0.5 mm, for example between 0.1 mm-0.2 mm, 0.15 mm-0.3 mm, 0.25-0.5 mm, or any intermediate, smaller or larger range of values.

According to some exemplary embodiments, the cavity 404 is formed during the manufacturing process of the PCB by reducing the number of layers in specific PCB regions aligned, for example, with a planned location of at least one energy transmitter or with a pad for positioning the energy transmitter. Alternatively, the cavity is formed by drilling through the PCB after the PCB is manufactured.

According to some exemplary embodiments, a PCB comprises a plurality of cavities. In some embodiments, the number of cavities is determined according to the number of heat generating elements mounted on a surface of the PCB, for example according to the number of energy transmitters mounted on the PCB surface. In some embodiments, the cavities are spaced-apart within the PCB. In some embodiments, a distance between two adjacent cavities is determined according to a distance between two adjacent energy transmitters or other heat generating elements aligned with the cavities.

According to some exemplary embodiments, for example as shown in FIG. 4B, the cavity is shaped and sized to receive at least a portion of a cooling element, for example to position the cooling element at a short distance from a heat generating element, for example from the energy transmitter. In some embodiments, the cooling element comprises a heat-conducting holder, for example a base holder, configured to conduct heat away from the energy transmitter, optionally towards an additional cooling element. In some embodiments, the holder is formed from a heat-conducting material, for example a heat-conducting metal or composition of metals, for example aluminum or any other metal.

According to some exemplary embodiments, the holder comprises at least one protrusion, for example a finger 414 which is shaped and sized to penetrate at least partly into the PCB 402 via the cavity 404. In some embodiments, a distal end 416 of the finger 414 is placed in contact with the PCB 402, or with at least one layer of the PCB on which the pad 408 or an energy transmitter is mounted. In some embodiments, the finger 414 penetrates into the PCB 402 through a surface 418 which is a different surface and optionally an opposite surface to the surface 410 onto which the energy transmitter is mounted. In some embodiments, a width of the finger, for example finger 414 is smaller than a width of the cavity 404, for example to allow easy insertion of the finger into the cavity.

According to some exemplary embodiments, for example as shown in FIG. 4C, a finger 420 has a distal end 422 that comprises at least one opening 424. Optionally, when inserting the finger 420 into the cavity 404, the at least one opening 424, optionally filled with air, is positioned between the finger 420 and the PCB 402.

Figure 4D:
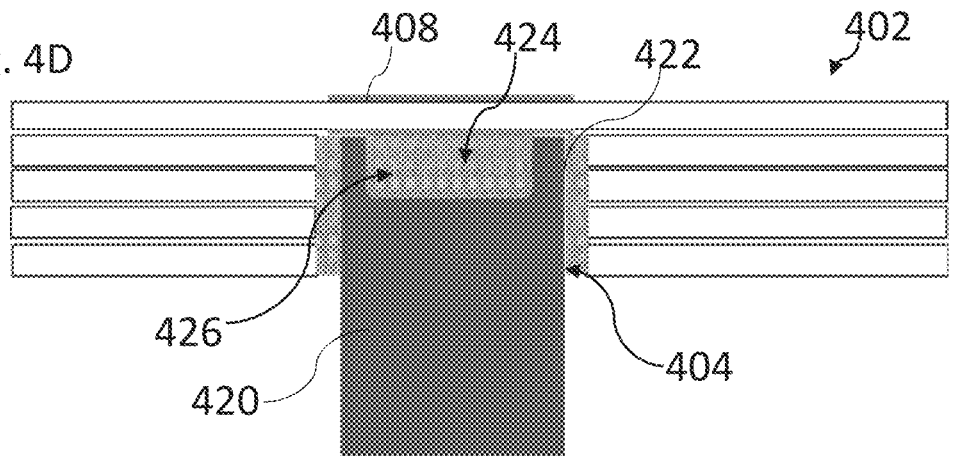

According to some exemplary embodiments, for example as shown in FIG. 4D, a filler material 426, for example an electrically and/or thermally conductive filler, is positioned in the cavity 404 and fills spaces between the finger 420 and/or the finger distal 422, for example opening 424, and the cavity walls. In some embodiments, the finger 420 is pushed into a cavity that contains the filler material. In some embodiments, the filler material comprises a glue, for example an epoxy glue, used to fix the finger 420 within the cavity 404, and/or to attach the finger 420 to the PCB 202. In some embodiments, the glue is an electrically and thermally conductive glue comprising metal particles, for example aluminum, silver and/or gold particles.

According to some exemplary embodiments, the filler material 426 is used as an interface between the holder and/or the holder finger in order, for example, to increase an adherence, electrical and/or thermal conductivity between the holder and the PCB.

Figure 4E:
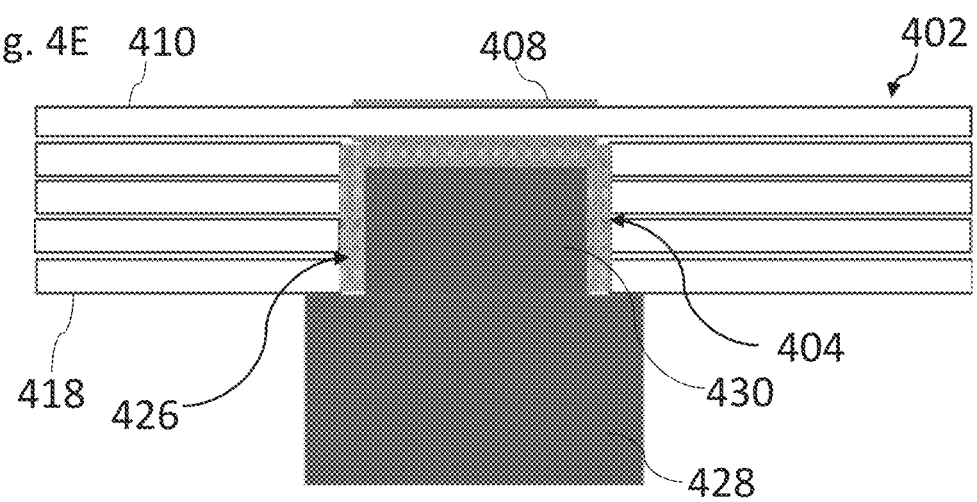

According to some exemplary embodiments, for example as shown in FIG. 4E, the holder body 428 contacts the PCB 402, while at least one finger 430 extending from the holder body 428 penetrates into the cavity 404 of the PCB 402. In some embodiments, the holder body 428 contacts the surface 418 which is a different surface, and optionally an opposite from the surface 410 on which at least one energy transmitter is mounted. In some embodiments, a length of the finger 430 is shorter or equal to the length of the cavity 404, for example to allow contact between the holder body and the PCB. Alternatively, for example as shown in FIGS. 4B-4D, the length of the holder finger is larger than a length 405 of the cavity 404.

Figure 4F:
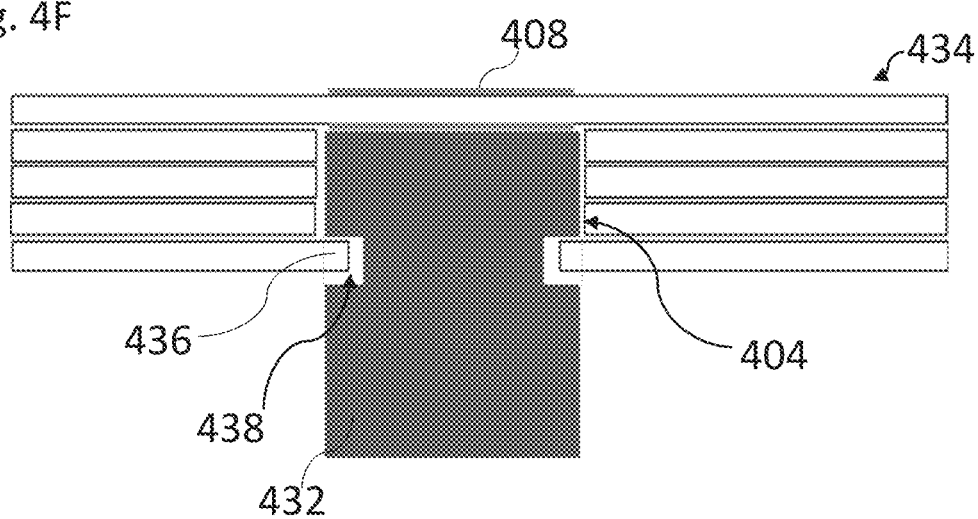
Figure 4G:
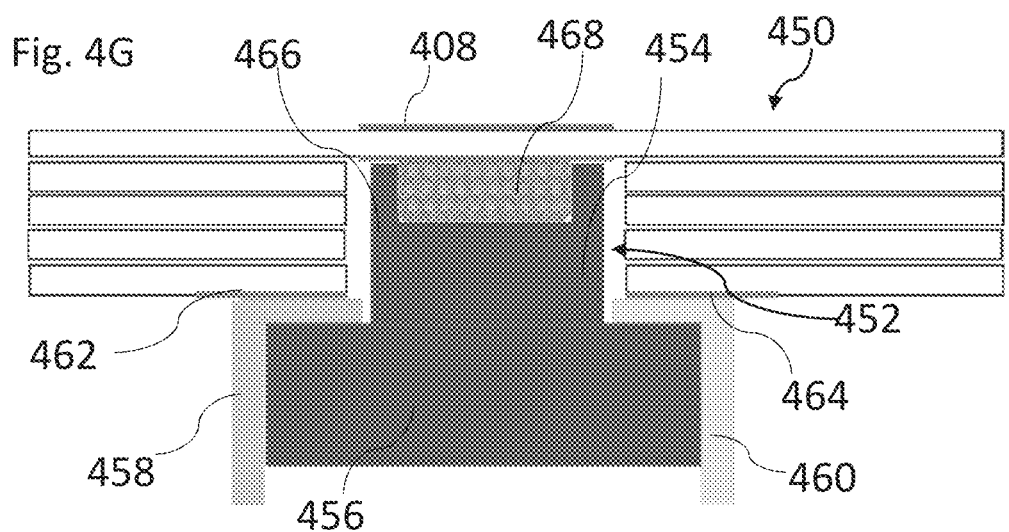

According to some exemplary embodiments, for example as shown in FIG. 4F, the holder finger 432 is configured to interlock with the PCB 434, for example via a snap-fit assembly. In some embodiments, the PCB 434 comprises at least one protruding edge 434, for example a flexible edge, which is configured to penetrate into an opening 438, for example a snap-in area, in the finger 432. In some embodiments, the snap-fit assembly comprising the at least one protruding edge 434 of the PCB 434 and the opening 438 in the finger 432, is a permanent snap-fit. Alternatively, the snap-fit assembly is a multi-use snap-fit. In some embodiments, the protruding edge 436 is formed from one of the layers of the PCB 434. In some embodiments, the protruding edge 436 protrudes into the cavity 404 of the PCB 434.

According to some exemplary embodiments, a PCB, for example PCB 450 comprises at least one cavity 452 that is shaped and sized to receive a finger 454 of a holder. In some embodiments, the finger 454 extends from a holder body 456 that comprises at least one electrical connector, for example connectors 458 and 460 that are configured to contact at least one electrical conductive pad, for example pads 462 and 464 of the PCB 450, respectively. In some embodiments, the electrical connectors of the holder are coupled to the pads of the PCB, when the holder finger 454 is inserted into the cavity 452. In some embodiments, an adhesive material 468, optionally the filler material 426 shown in FIGS. 4D and 4E, fills the cavity 452, and optionally an opening 468 at the distal end 466 of the finger 454, to glue together the finger 454 and the PCB 450. In some embodiments, the adhesive material 468 allows to maintain a stable electrical connection between the holder and the PCB via the connectors 458 and 460 and the pads 462 and 464, by fixing a position of the finger 454 within the cavity 452. In some embodiments, electrical power is delivered from the holder to one or more elements mounted on the PCB, via the connectors 458 and 468 of the holder.

Exemplary Holder Fingers in Cavity

Figure 5A:
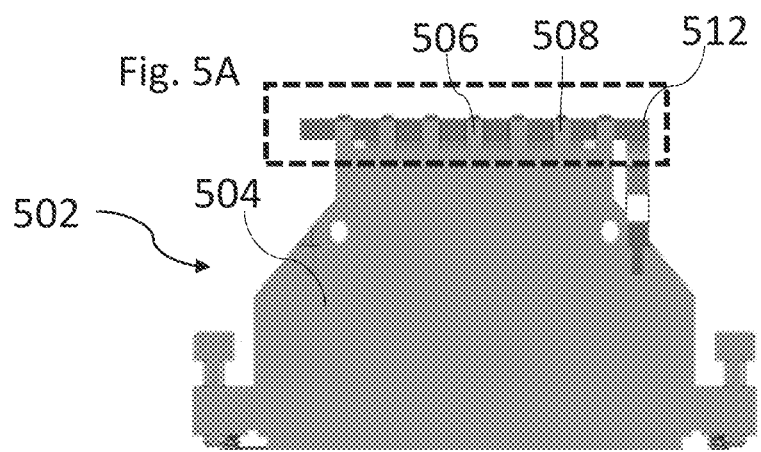
FIGS. 5A-5F are schematic illustrations of a heat conducting holder having a plurality of extensions shaped as fingers, placed within cavities of a PCB, according to some exemplary embodiments of the invention.
Figure 5B:
Figure 5C:
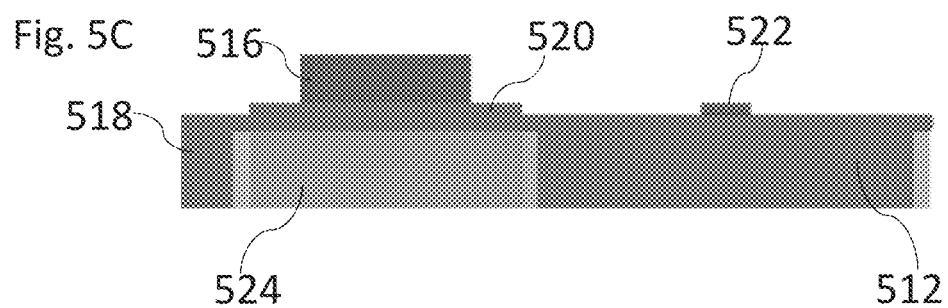

Reference is now made to FIGS. 5A-5C, depicting a PCB and a holder, where extensions of the holder, for example fingers, penetrate into cavities formed within the PCB, according to some exemplary embodiments of the invention.

According to some exemplary embodiments, a holder 502 comprises a holder body 504 and a plurality of extensions, for example fingers 506 and 508, extending from the body 504. In some embodiments, for example as shown in FIG. 5B, each finger penetrates into the PCB 512 via a cavity in the PCB 512. In some embodiments, each cavity crosses at least 50% of the PCB, for example at least 60%, at least 80%, at least 90% of the PCB. In some embodiments, each cavity or at least some of the cavities in a PCB cross the entire PCB.

According to some exemplary embodiments, for example as shown in FIG. 5C, the PCB 512 comprises at least one energy transmitter, for example an ultrasound transducer 516 mounted on a surface 518 of the PCB 512, for example by at least one pad 520 attached to the surface 518. In some embodiments, the PCB comprises at least one sensor, for example a thermistor 522 for measuring temperature. In some embodiments, the thermistor 522 is mounted on a surface of the PCB, for example surface 518. In some embodiments, for example as shown in FIG. 5C, a holder finger 524 is aligned with the location of the ultrasound transducer 516 on the surface 518, and is laterally spaced-apart from the thermistor 522.

Figure 5D:
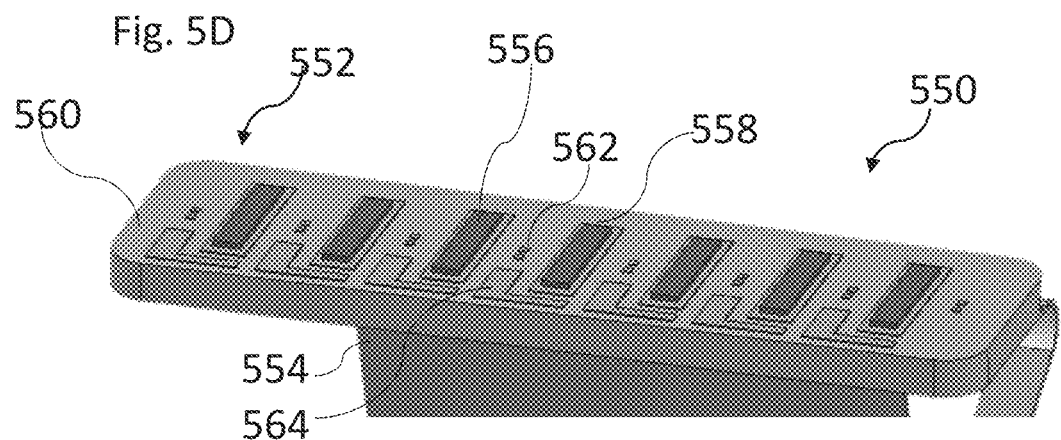
Figure 5E:
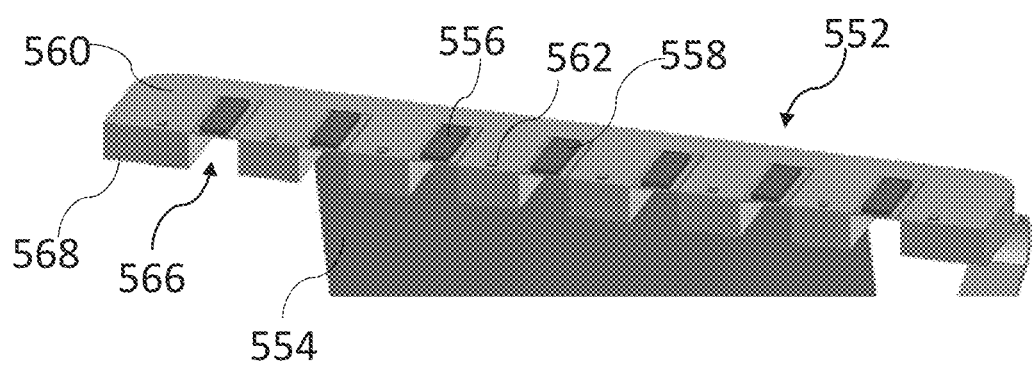

Reference is now made to FIGS. 5D and 5E, depicting a rigid region of a PCB with a plurality of openings shaped and sized to receive fingers of a holder, according to some exemplary embodiments of the invention.

According to some exemplary embodiments, a PCB 550 comprises at least one rigid region 552 and at least one flexible region 554 coupled to the rigid region 552. In some embodiments, the flexible region 554 comprises electrical wiring extending to the rigid region 552. In some embodiments, the rigid region 552 comprises at least two energy transmitters, for example at least two ultrasound transducers 556 and 558 mounted on a first surface 560 of the rigid region 552. In some embodiments, the at least two ultrasound transducers, for example transducers 556 and 558 are spaced apart on the surface 560.

According to some exemplary embodiments, the rigid region 552 comprises at least one sensor, for example thermistor 562 mounted on the surface 560. In some embodiments, the thermistor 562 is configured to measure temperature levels of tissue contacting directly or indirectly the surface 560, and/or the transducers 556 and 558. In some embodiments, the thermistor 562 is positioned at a distance from heat conducting and/or heat generating elements, for example ultrasound transducers 556 and 558, for example not to interfere with the temperature measurements. In some embodiments, a single thermistor, for example thermistor 562 is positioned between two adjacent ultrasound transducers 556 and 558 on the surface 560. In some embodiments, for example as shown in FIG. 5D, at least one electrical connection 564 between the thermistor 562 and/or an ultrasound transducer, and the electrical wiring of the PCB, is present on the surface 560.

According to some exemplary embodiments, for example as shown in FIG. 5E, the rigid region 552 comprises a plurality of cavities, for example cavity 566, penetrating into the rigid region 560 via a second surface 568, which is opposite to the first surface 560 onto which the ultrasound transducers and/or the thermistors are mounted. In some embodiments, the plurality of cavities end at a distance from the first surface 560.

Figure 5F:
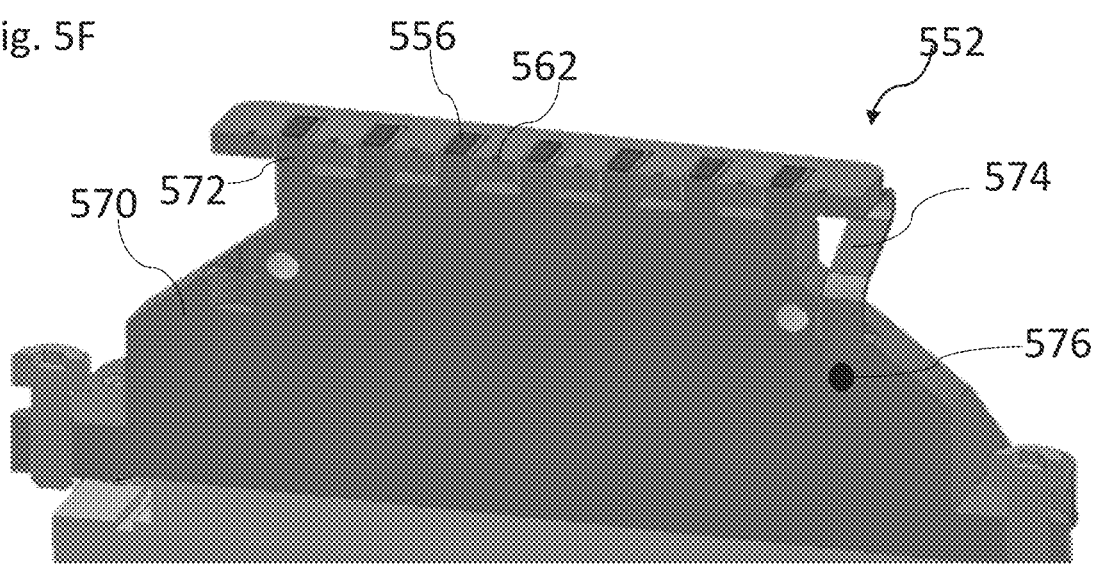

According to some exemplary embodiments, for example as shown in FIG. 5F, the rigid region 552 of the PCB is positioned on top of a holder body 570, for example a heat-conducting holder body, such that protrusions, for example fingers extending from the holder body 570, for example finger 572, are inserted into the cavities in the rigid region 552, for example as also shown in FIGS. 5A-5C.

According to some exemplary embodiments, the PCB comprises at least one additional flexible region 574 coupled, for example electrically and mechanically coupled to the rigid region 552. In some embodiments, the at least one additional flexible region comprises at least one thermistor 576 for measuring temperature levels of the holder body 570.

Exemplary Flat PCB

According to some exemplary embodiments, the PCB, for example a rigid region of the PCB on which the at least one energy transmitter, is flat and does not contain penetrating cavities. In some embodiments, a flat surface of the PCB, for example a different surface of the PCB from the surface on which the at least one energy transmitter is mounted, contacts a holder. In some embodiments, the flat surface of the PCB contacts a flat surface of the holder. Alternatively, the flat surface of the PCB contacts one or more extension, for example fingers of the holder.

Reference is now made to FIGS. 6A-6B depicting an assembly between a flat surface of a PCB and a holder with extending fingers, according to some exemplary embodiments of the invention.

According to some exemplary embodiments, PCB 602 comprises a first surface 604 and a second surface 606. In some embodiments, the PCB 602 comprises at least one energy transmitter, for example at least two spaced-apart energy transmitters 608 and 610 mounted on the first surface 604. In some embodiments, the PCB 602 comprises at least one sensor, for example at least one temperature sensor 612 mounted on the first surface 604. In some embodiments, the at least one temperature sensor comprises at least two temperature sensors, for example thermistors 612 and 614. In some embodiments, the at least one temperature sensor is configured to measure a temperature of a tissue, for example skin, contacting directly or indirectly the surface 602.

According to some exemplary embodiments, the PCB 602 is attached to a heat-conducting holder, for example holder 616 comprises a holder body 618 and one or extensions, for example spaced-apart fingers 620 and 622, extending from the body 618. In some embodiments, the fingers 620 and 622 contact the second surface 606, and are aligned according to the position of the energy transmitters, for example transmitters 608 and 610 on the first surface 604. In some embodiments, aligning the fingers with the energy transmitters allows, for example, to selectively conduct heat from the energy transmitters, to selectively cool the energy transmitters without thermally affecting the temperature sensors, for example thermistor 612 positioned between two adjacent energy transmitters.

According to some exemplary embodiments, the openings, for example spaces, between adjacent holder fingers are aligned according to a position of the at least one sensor mounted on the first surface 604, for example sensor 612. In some embodiments, the openings between the spaced-apart fingers, for example opening 624 are filled with a thermal insulation material, to increase thermal insulation of the at least one temperature sensor, for example sensor 612 from the holder 616. In some embodiments, for example as shown in FIG. 6A, the openings, for example opening 624 is filled with air. Alternatively, for example as shown in FIG. 6B, the opening 624 is filled with an insulation material comprising air, Nitrogen gas, gas filled small polymer particles, gas filled small silica particles, and/or glass fibers.

Figure 7C:
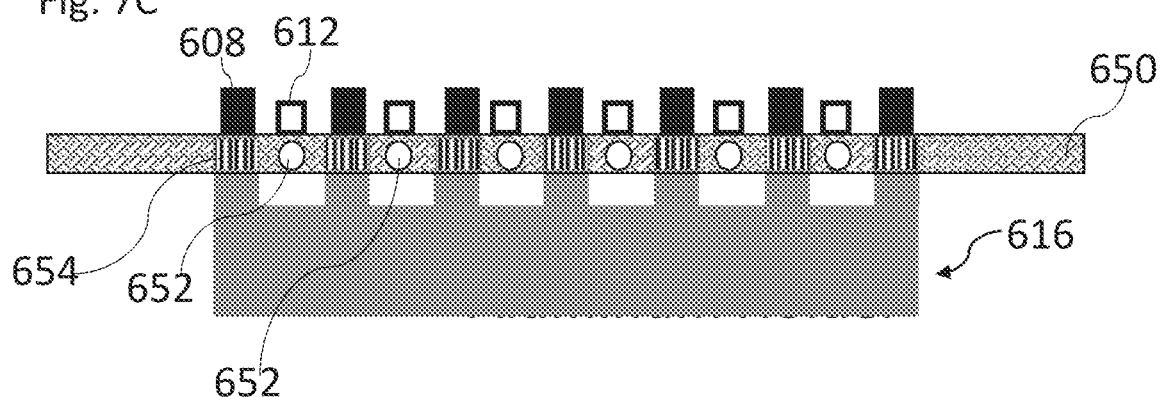

Reference is now made to FIGS. 7A-7C depicting a flat PCB comprising at least one heat-conducting region and/or at least one thermally insulated region, attached to fingers of a heat-conducting holder, according to some exemplary embodiments of the invention. In some embodiments.

According to some exemplary embodiments, for example as shown in FIG. 7A, a flat surface 606 of PCB 630 is attached to fingers of a heat-conducting holder 616. In some embodiments, the PCB 630 comprises at least one via, for example via 632 in the PCB between the holder, for example the holder finger contacting the surface 606 and an energy transmitter, for example energy transmitter 608. In some embodiments, the via 632 formed in the PCB 630 is filled with a heat-conducting material, for example Copper, Gold, Aluminum, Silver, Carbon, or a mixture thereof, for example to increase heat conductivity between the holder 616 and the energy transmitter 608. In some embodiments, at least 50%, for example at least 70%, at least 80%, at least 90%, at least 95%, at least 98% or any intermediate, smaller or larger percentage value of the via 632 volume is filled with the heat-conducting material. Optionally, the entire via 632 volume is completely filled with the heat-conducting material. In some embodiments, the via is a hole drilled through the PCB body. In some embodiments, the via 632 filled with the heat-conducting material is aligned with the energy transmitter and/or is laterally spaced-apart from at least one sensor, for example temperature sensor 612 mounted on the surface 604.

According to some exemplary embodiments, for example as shown in FIG. 7B, a flat surface 606 of PCB 640 contacts a holder 616, for example to the holder fingers. In some embodiments, the PCB 640 comprises one or more implants, for example inserts within the PCB 640 body. In some embodiments, the one or more implants, for example implant 642 is a heat-conducting implant comprises heat-conducting material, for example Copper, Aluminum, Brass, Gold In some embodiments, the heat conducting implants, for example implant 642 is positioned between the holder, for example between a finger 620 of the holder and an energy transmitter, for example transmitter 608 mounted on the PCB. In some embodiments, the heat-conducting implant position is aligned with a position of the energy transmitter 608 and/or is laterally spaced-apart from a sensor, for example a temperature sensor 612, mounted on the PCB 640.

According to some exemplary embodiments, the implant in the PCB body crosses through the PCB 640. Alternatively, the implant penetrates through at lets one surface of the PCB 640. Alternatively, the implant is positioned within the PCB 640 and at a distance from the PCB external surfaces, for example surfaces 604 and 606.

According to some exemplary embodiments, for example as shown in FIG. 7C, a PCB 650 comprises at least one thermally insulated region 652, for example a via filled with a thermally insulating material, or an implant, for example an insert filled with the thermally insulating material. In some embodiments, the at least one thermally insulated region 652 is positioned in the PCB 650 between the holder 616, and at least one sensor, for example the temperature sensor 612 mounted on the surface of the PCB 650. In some embodiments, the at least one thermally insulated region 652 is configured to increase thermal insulation of the at least one sensor from the holder 616. In some embodiments, the thermally insulating material comprises glass fibers.

According to some exemplary embodiments, the at least one thermally insulated region is aligned with the at least one sensor, and/or is laterally spaced-apart from at least one energy transmitter mounted on the PCB 650. In some embodiments, the at least one thermally insulated region crosses through the PCB 650 or through at least one surface, for example an external surface, of the PCB 650. Alternatively, the at least one thermally insulated region is positioned within the PCB 650 at a distance from the external surfaces of the PCB 650.

According to some exemplary embodiments, for example as shown in FIG. 7C, a PCB 650 comprises at least one thermally conducting region 654 and at least one thermally insulated region 652. In some embodiments, the at least one thermally conducting region is aligned with the position of the energy transmitter 608 and/or is laterally spaced apart from the at least one sensor 612, for example as described in FIGS. 7A and 7B with respect to via 632 and implant 642, respectively.

Reference is now made to FIGS. 8A-8D, depicting a PCB having a flat surface contacting a flat surface of a holder, for example a heat-conducting holder, according to some exemplary embodiments of the invention.

Figure 8A:
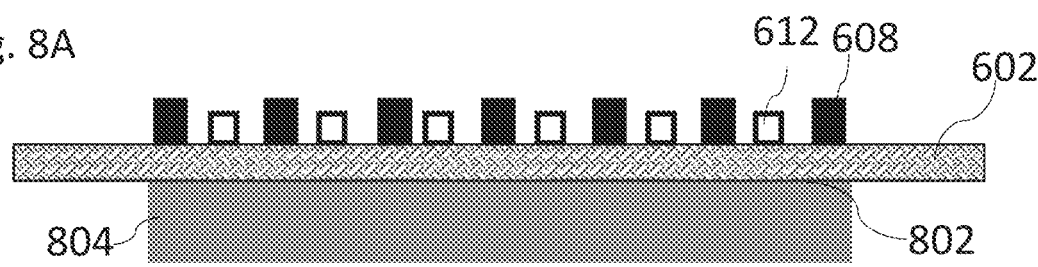
FIG. 8A is a schematic illustration of a PCB having a flat surface positioned on a flat surface of a holder, according to some exemplary embodiments of the invention.

According to some exemplary embodiments, for example as shown in FIG. 8A, the PCB 602, previously shown in FIGS. 6A and 6B is placed in contact with a flat surface 802 of a holder 804.

Figure 8B:
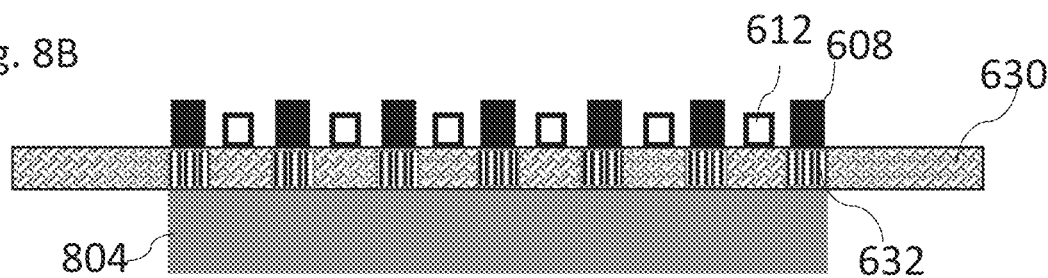
FIGS. 8B-8D are schematic illustrations of a PCB having a flat surface and at least one heat conducting region and/or at least one thermal insulating region, positioned on a flat surface of a holder, according to some exemplary embodiments of the invention.

According to some exemplary embodiments, for example as shown in FIG. 8B, a PCB 630, previously shown in FIG. 7A, is placed in contact with a flat surface of the holder 804. In some embodiments, as described with respect to FIG. 7A, the PCB 630 comprises at least one via 632.

Figure 8C:
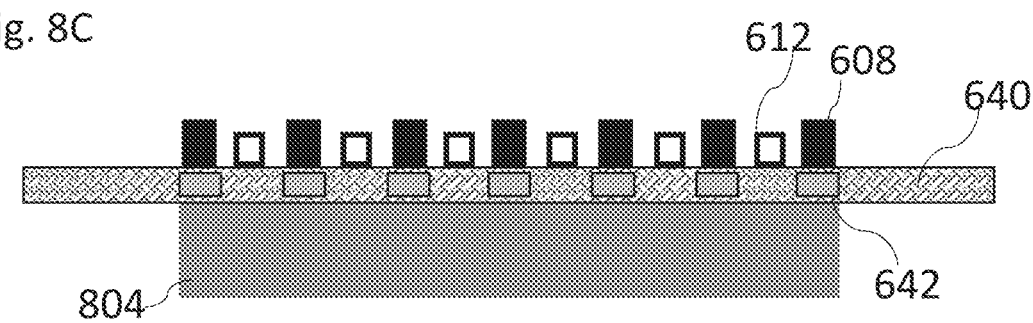

According to some exemplary embodiments, for example as shown in FIG. 8C, a PCB 640, previously shown in FIG. 7B, is placed in contact with the flat surface of the holder 804. In some embodiments, as described with respect to FIG. 7B, the PCB 640 comprises at least one implant 642.

Figure 8D:
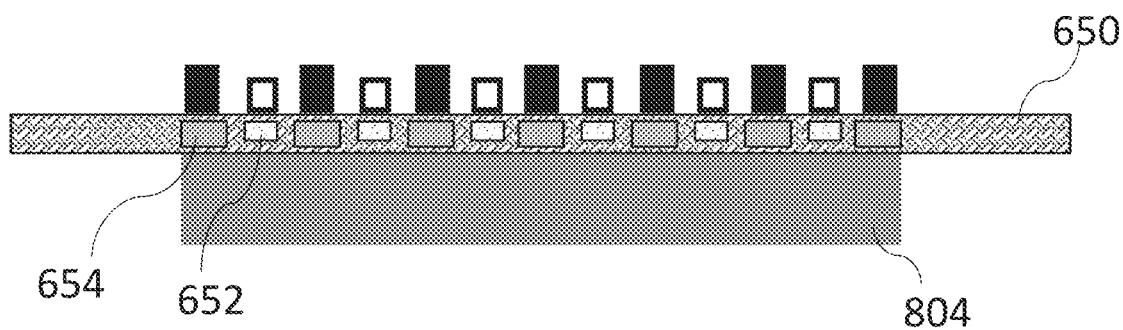

According to some exemplary embodiments, for example as shown in FIG. 8D, a PCB 650, previously shown in FIG. 7C, is placed in contact with the flat surface of the holder 804. In some embodiments, as described with respect to FIG. 7C, the PCB 650 comprises at least comprises at least one thermally conducting region 654 and at least one thermally insulated region 652. Alternatively, the PCB comprises only at least one thermally insulated region 652.

Exemplary PCB with at Least One Inner Cooling Channel

Figure 9A:
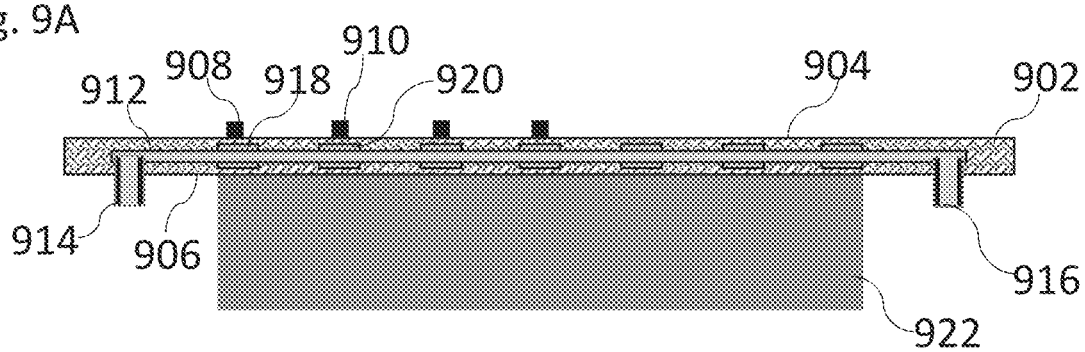
FIG. 9A is a schematic illustration of a PCB having an inner cooling element, according to some exemplary embodiments of the invention.
Figure 9B:
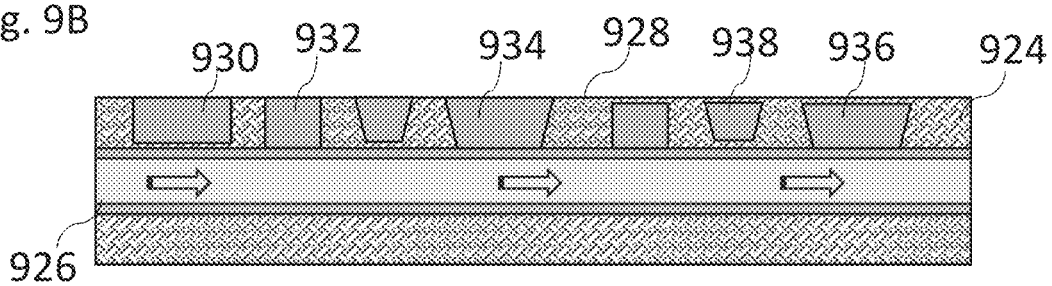
FIGS. 9B-9C are schematic illustrations of a PCB having an inner cooling element and at least one heat-conducting element between the inner cooling element and a PCB surface on which energy transmitters are mounted, according to some exemplary embodiments of the invention.
Figure 9C:
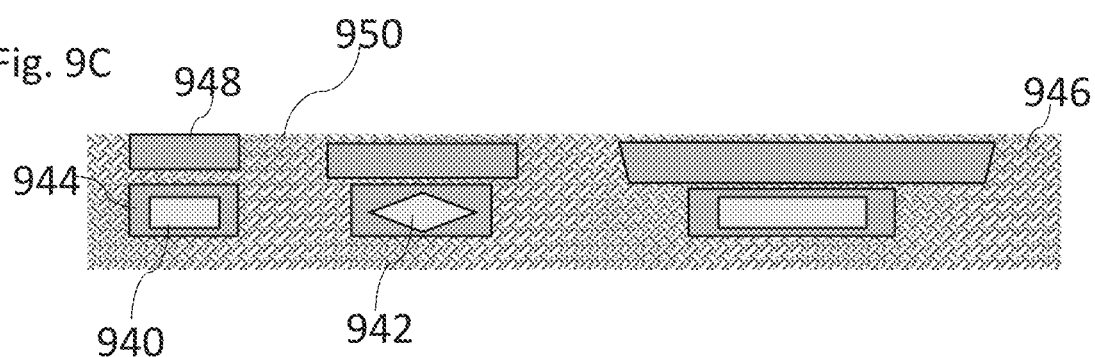

According to some exemplary embodiments, a PCB comprises at least one energy transmitter mounted on a first surface of the PCB, and at least one inner cooling element, for example a cooling channel, passing within the PCB. In some embodiments, the cooling channel is shaped and sized to deliver, for example to circulate, cooling fluid within the PCB, to cool down the at least one energy transmitter and/or the first surface of the PCB. In some embodiments, the at least one cooling channel passes through at least one second surface of the PCB. Reference is now made to FIGS. 9A-9C depicting a PCB with an inner cooling element, according to some exemplary embodiments of the invention.

According to some exemplary embodiments, PCB 902 has a first surface 904 and a second surface 906. In some embodiments, the PCB 902 comprises at least one, for example at least two energy transmitters mounted on the first surface 904, and at least one inner cooling element, for example a cooling channel 912 passing within the PCB 902. In some embodiments, the at least one cooling channel 912 comprises a least one inlet 914 and at least one outlet 916, optionally extending out from the PCB 902. In some embodiments, the inlet 914 and/or the outlet 916 extend through a surface which is different from the first surface 904, for example through the second surface 906. Optionally, the second surface 906 is opposite to the first surface 904.

Optionally, the PCB comprises one or more heat conducting regions, for example region 918, between the inner cooling element, for example channel 912 and at least one energy transmitter, for example transmitter 908. In some embodiments, the region 918 at least partly or completely surrounds the channel 912. In some embodiments, the region 918 comprises a heat-conducting implant made from a heat-conducting material, for example copper. In some embodiments, the heat-conducting implant is attached to the channel 912, for example to channel 912 wall.

According to some exemplary embodiments, the PCB 902 comprises a plurality of spaced-apart heat conducting implants, for example implant 920, positioned between the channel 912 and the energy transmitters mounted on the surface 904, for example transmitters 908 and 910. In some embodiments, the spaced-apart heat conducting elements are aligned with the energy transmitters. Optionally, the second surface 906, which is optionally a flat surface, contacts a heat-conducting holder 922, for example a flat surface of the holder 922.

According to some exemplary embodiments, for example as shown in FIG. 9B, a PCB 924 comprises at least one cooling channel 926, passing within the PCB 924. In some embodiments, at least one heat-conducting implant is positioned between the channel 926 and a surface 928 on which energy transmitters are positioned. In some embodiments, the at least one heat-conducting implant has a polygonal, oval, or round cross-section. Optionally, the at least one heat-conducting implant has a rectangle cross section, for example implant 930, or a cross-section of a square, for example implant 932, or a cross-section of a trapezoid, for example implant 934.

According to some exemplary embodiments, the heat-conducting implant, for example implant 936, is in contact with channel 926 and is spaced-apart from the surface 928. Alternatively, the heat-conducting implant, for example implant 930, is in contact with the surface 928 and is spaced-apart from the channel 926. Alternatively, the heat-conducting implant, for example implant 932 is in contact with both the channel 926 and the surface 928. Alternatively, the heat-conducting implant, for example implant 938 is spaced-apart from both the surface 928 and the channel 926.

According to some exemplary embodiments, for example as shown in FIG. 9C, a cooling channel has a polygonal cross section, an oval cross section or a round cross section. In some embodiments, the cooling channel, for example cooling channel 940 has a rectangle cross section. In some embodiments, the cooling channel, for example cooling channel 942 has a cross-section of a rhombus.

According to some exemplary embodiments, for example as shown in FIG. 9C, a cooling channel, for example cooling channel 940 is at least partly surrounded by a heat-conducting implant 944, which optionally contacts the cooling channel 940 wall. Additionally, the PCB 946 further comprises at least one heat conducting implant, for example implant 948 between the channel, for example channel 940 and the surface 950 on which at least one energy transmitter is mounted.

According to some exemplary embodiments, in a similar way to the description of the heat conducting implants, in FIGS. 9A-9C, the PCB comprises at least one thermal insulating implant that is optionally shaped and sized as the heat conducting implants described in FIGS. 9A-9C.

Exemplary Energy-Emitting Assembly with an Inner Cooling Element

Figure 10A:
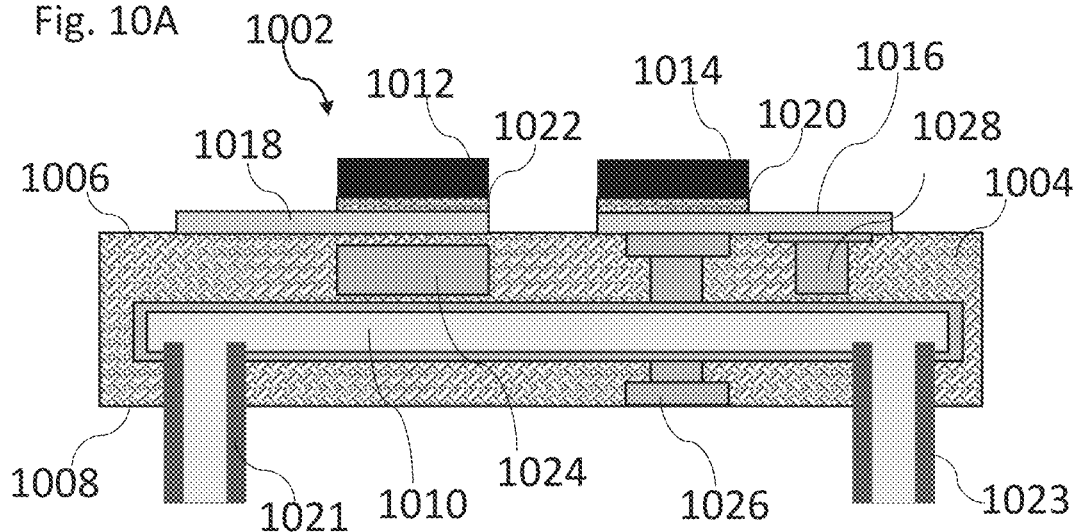
FIGS. 10A-10C are schematic illustrations showing cross section views of energy transmitters mounted on a PCB with an inner cooling element, according to some exemplary embodiments of the invention.
Figure 10B:
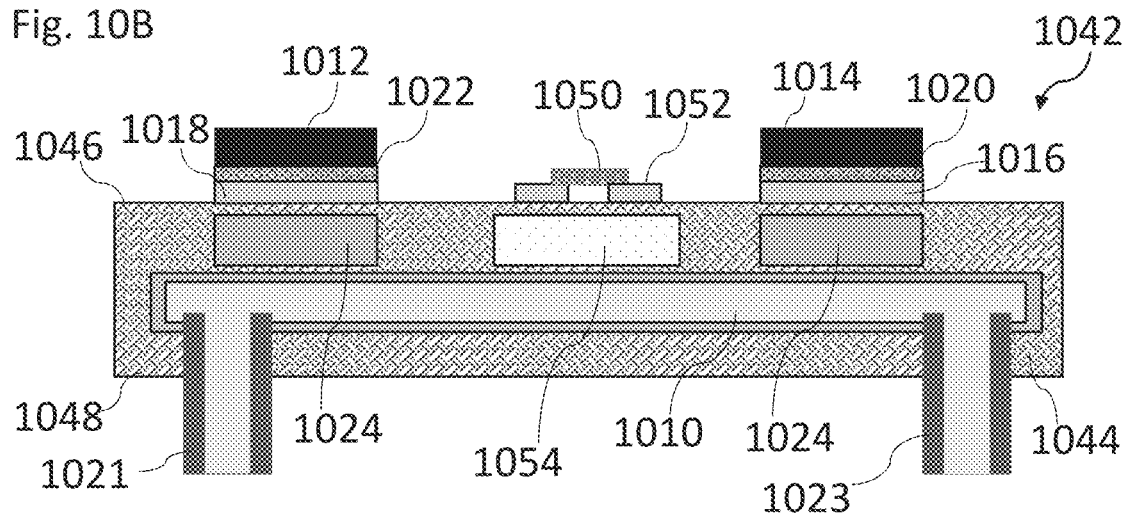
Figure 10C:
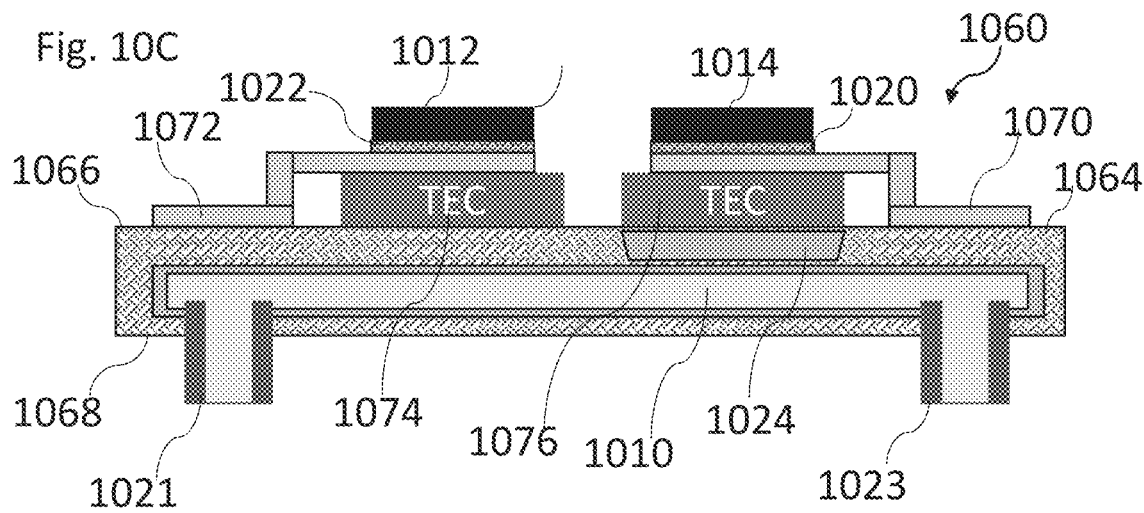

Reference is now made to FIGS. 10A-10C, depicting an energy-emitting assembly, which comprises a PCB with an inner cooling element, according to some exemplary embodiments of the invention.

According to some exemplary embodiments, for example as shown in FIG. 10A, an energy emitting assembly 1002 comprising a PCB 1004 having a first surface 1006 and a second surface 1008, optionally an opposite surface, and at least one inner cooling element, for example cooing channel 1010 passing within the PCB 1004. In some embodiments, the assembly 1002 comprises at least one energy emitting transmitter, for example ultrasound transducers 1012 and 1014, mounted on the first surface 1006 via an electrically conducting pad, for example pads 1016 and 1018 attached to the first surface 1006, and optionally an electrically conductive film, for example films 1020 and 1022 disposed between the pads and the transducers.

According to some exemplary embodiments, the assembly 1002 comprises at least one heat conducting element between the channel 1010 and the first surface 1006. In some embodiments, the at least one heat conducting element comprises a heat conducting implant, for example implant 1024, positioned within the PCB 1004 between the channel 1010 and the surface 1006. Optionally, the implant 1024 is spaced apart from the surface 1006 and/or the channel 1010. In some embodiments, the heat conducting element comprises a VIA 1026 filled with a heat-conducting material, crosses the PCT between the first surface 1006 and the second surface 1008. In some embodiments, the heat conducting element comprises a VIA 1028 filled with a heat-conducting material, and positioned between channel 1010 and the first surface 1006. In some embodiments, the VIA 1028 crosses through the first surface and is spaced-apart from the channel 1010.

According to some exemplary embodiments, the heat conducting elements, for example the implants 1024, the VIA 1026 and the VIA 1028, are aligned with at least one of the pads 1016 and 1018, and/or the position of the energy transmitters 1012 and 1014.

According to some exemplary embodiments, for example as shown in FIG. 10B, an energy emitting assembly 1042 comprising a PCB 1004 having a first surface 1046 and a second surface 1048, optionally an opposite surface, and at least one inner cooling element, for example cooing channel 1010 passing within the PCB 1044. In some embodiments, the assembly 1042 comprises at least one energy emitting transmitter, for example ultrasound transducers 1012 and 1014, mounted on the first surface 1046 via an electrically conducting pad, for example pads 1016 and 1018 attached to the first surface 1006, and optionally an electrically conductive film, for example films 1020 and 1022 disposed between the pads and the transducers.

According to some exemplary embodiments, the assembly 1042 further comprises at least one temperature sensor 1050, mounted on the first surface 1006 via electrically conducting pads 1052 attached to the first surface 1006.

According to some exemplary embodiments, the assembly 1042 comprises at least one heat conducting element between the channel 1010 and the first surface 1006. In some embodiments, the at least one heat conducting element comprises a heat conducting implant, for example implant 1024, positioned within the PCB 1044 between the channel 1010 and the first surface 1046. Optionally, the implant 1024 is spaced apart from the surface 1046 and/or from the channel 1010. In some embodiments, the assembly 1042 comprises at least one thermally insulating element, for example a thermal insulator 1054, positioned within the PCB 1044 between the channel 1010 and the pads 1052 and/or the temperature sensor 1050.

According to some exemplary embodiments, the thermal insulator 1054 is aligned with the position of the at least one temperature sensor 1050 on the first surface 1046 of the PCB 1044.

According to some exemplary embodiments, for example as shown in FIG. 10C, an energy emitting assembly 1060 comprising a PCB 1064 having a first surface 1066 and a second surface 1068, optionally an opposite surface, and at least one inner cooling element, for example cooing channel 1010 passing within the PCB 1064. In some embodiments, the assembly 1060 comprises at least one cooling element, for example thermoelectric coolers (TECs) 1074 and 1076, attached to the first surface 1066. In some embodiments, the TECs are spaced-apart on the first surface 1066. In some embodiments, the assembly 1060 comprises at least one energy emitting transmitter, for example ultrasound transducers 1012 and 1014, mounted on the first surface 1066 via an electrically conducting pad, for example pads 1070 and 1072, each is attached to a surface of a different TEC of TECs 1074 and 1076, and optionally an electrically conductive film, for example films 1020 and 1022 disposed between the pads and the transducers. In some embodiments, each pf the pads, for example pads 1020 and 1022 is attached to a cold surface of the TEC, for example TECs 1074 and 1076. In some embodiments, a hot surface of each TEC is attached to the first surface 1066 of the PCB 1064.

According to some exemplary embodiments, the assembly 1042 further comprises at least one heat conducting element between the channel 1010 and the first surface 1006, and at least one TEC, for example a hot surface of the TEC, for example TEC 1076. In some embodiments, the at least one heat conducting element comprises a heat conducting implant, for example implant 1024, positioned within the PCB 1044 between the channel 1010 and the first surface 1066 and the TEC 1076.

According to some exemplary embodiments, the cooling channel 1010, for example as shown in FIGS. 10A-10C comprises at least one inlet 1021 and at least one outlet 1023, passing through the second surface of the PCB.

According to some exemplary embodiments, several cooling elements, for example a plurality of cooling elements pass within the PCB. In some embodiments, each cooling channel of the plurality of cooling channel is aligned with a single energy transmitter on the PCB, for example to individually cool a specific energy transmitter. Alternatively, a single cooling channel of the plurality of cooling channels is aligned with two or more energy transmitters, for example to cool the two or more energy transmitters.

A potential advantage of having several cooling channel and optionally an individual cooling channel for each energy transmitter may be to allow a more efficient and/or uniform cooling process of all the energy transmitters on the PCB.

Exemplary Energy Emitting Assembly

Reference is now made to FIGS. 11A-11G depicting an energy-emitting assembly, according to some exemplary embodiments of the invention.

According to some exemplary embodiments, for example as shown in FIG. 11A, a PCB 1102 comprises at least one first rigid region 1104 which includes at least one energy transmitter, for example at least one ultrasound transducer 1106, and a at least one second rigid region 1108, interconnected mechanically and/or electrically, by a flexible region 1110. In some embodiments, the at least one ultrasound transducer 1106 is mounted on a first surface of the at least one first rigid region 1104. In some embodiments, at least one sensor, for example a temperature sensor 1112 is mounted on the first surface. According to some exemplary embodiments, for example as shown in FIG. 11B, the at least one first rigid region 1104 is placed in contact with at least one cooling element, for example a heat-conductive holder 1114. In some embodiments, a second surface of the at least one rigid region 1104 which is different from the surface on which the at least one ultrasound transducer is mounted, is in contact with the holder 1114. In some embodiments, at least part of the holder 1114 is in contact with at least one additional cooling element, for example a TEC 1116 and/or a heat exchanger. Optionally, at least part of the holder is in contact with a cold surface of a TEC, and a hot surface of the TEC is in contact with the heat exchanger. Alternatively, the second surface of the at least one rigid region 1104 is in contact with the heat exchanger According to some exemplary embodiments, for example as shown in FIGS. 11C and 11E, a cover 1118 is placed on top the PCB. In some embodiments, the rigid region 1104 extends through an opening of the cover 1118. In some embodiments, the cover 1118 is a cover of an applicator, for example an ultrasound applicator. In some embodiments, the cover 1118 surrounds the PCB and the holder 1114, for example to close gaps between the holder and the rigid region of the PCB from penetration of external element. Additionally or alternatively, the cover 1118 provides mechanical support to the energy transmitting assembly 1102.

According to some exemplary embodiments, the cover 1118 geometrically interlocks with the PCB, for example with the rigid region 1104 of the PCB.

According to some exemplary embodiments, for example as shown in FIGS. 11D and 11E, the rigid region 1104 and the at least one ultrasound transducer are covered with at least one coating layer 1120, for example an insulating layer, configured to seal the rigid region 1104 and the at least one ultrasound transducer from fluids and/or humidity. In some embodiments, the at least one coating layer comprises a sealing layer, for example a Parylene and optionally Paylene C, scaling layer. Alternatively or additionally, the at least one coating layer comprises an electrical insulation material, for example Kapton. In some embodiments, for example as shown in FIGS. 11D, the coating layer 1120 is placed on top the cover 1118, for example on top or distally an opening in the cover through which the at least one ultrasound transducer is exposed.

Figure 11F:
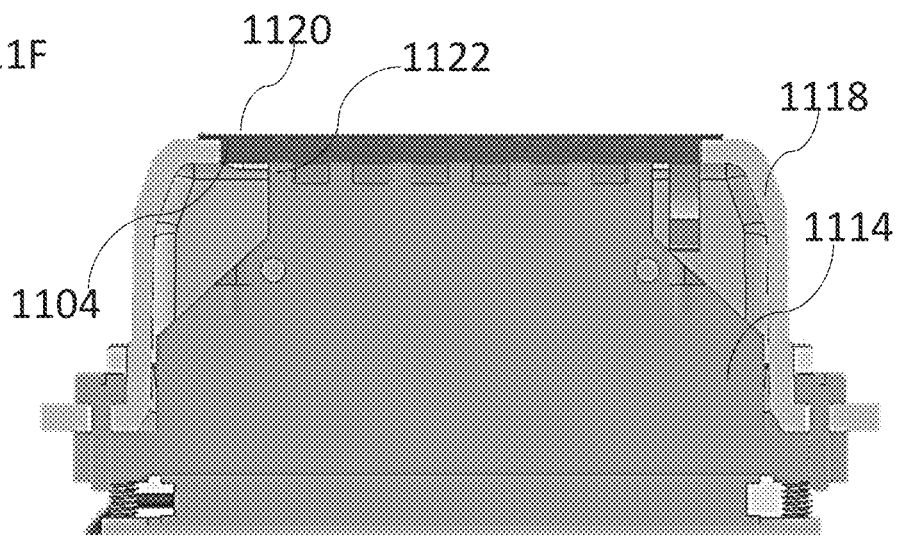
Figure 11G:
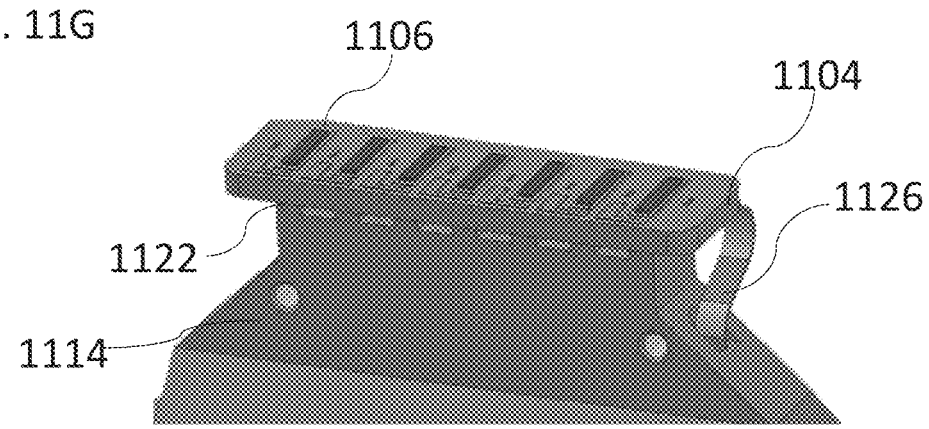
FIGS. 11G-11H are schematic illustrations showing a flexible region of a PCB attached to a holder, according to some exemplary embodiments of the invention.

According to some exemplary embodiments, for example as shown in FIGS. 11F and 11G, the rigid region 1104 of the PCB is placed on top a holder having one or more extensions or fingers, for example finger 1122. In some embodiments, at least some of the fingers or each finger, is aligned with a position of at least one ultrasound transducer, for example transducer 1106, mounted on the rigid region 1104. In some embodiments, at least some of the fingers or each finger, penetrates into the rigid region 1104 via a cavity in the PCB, as previously described in FIGS. 4A-4F. Alternatively, the rigid region 1104 is paced on the fingers.

Figure 11H:
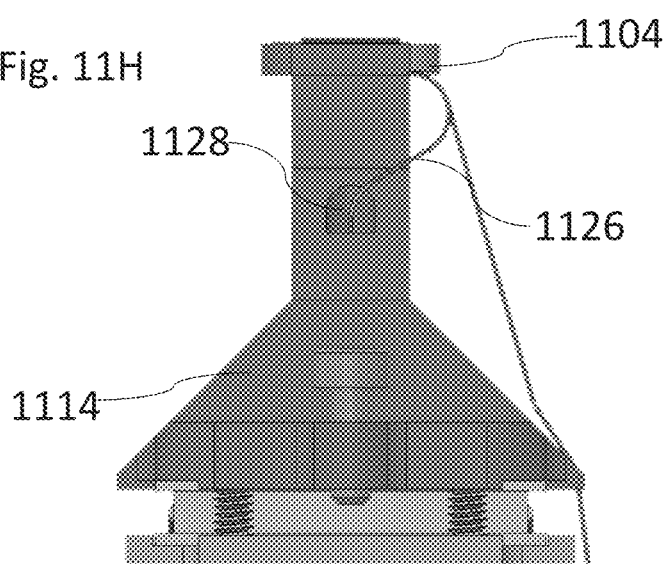

According to some exemplary embodiments, for example as shown in FIGS. 11G and 11H, at least one flexible region, for example flexible strip 1126 is mechanically and electrically coupled to the rigid region 1104. In some embodiments, the flexible strip 1126 comprises a temperature sensor, for example a thermistor, for measuring the temperature of the holder. In some embodiments, the flexible strip 1126 is configured to bend and to place the thermistor is contact with the holder 1114, for example within an opening 1128 in the holder 1126.

Exemplary PCB and Transmitter Electrical Wiring

Reference is now made to FIGS. 12A-12D depicting electrical wiring between a PCB and electrodes of an ultrasound transducer, for example electrodes attached to a piezoelectric element of the ultrasound transducer, according to some exemplary embodiments of the invention.

According to some exemplary embodiments, a piezoelectric element, for example PZT 1202 comprises at least one first electrode 1204, for example a distal electrode, located at a distance from a PCB 1206, and at least one second electrode 1208, for example a proximal electrode located closer to the PCB 1206. In some embodiments, an electrical-conductive pad 1210 is attached to the PCB 1206. Additionally, the pad 1210 is attached to the proximal electrode 1208 by an electrical conductive adhesive material 1212, for example glue. In some embodiments, the adhesive 1212 comprises a plurality of electrical conductive particles within a non-conductive glue matrix represented in the figures as short lines and/or a grid. In some embodiments, the pad 1210 is formed from an electrical conductive metal, for example, copper, silver, gold, aluminum or any combination thereof.

Figure 12A:
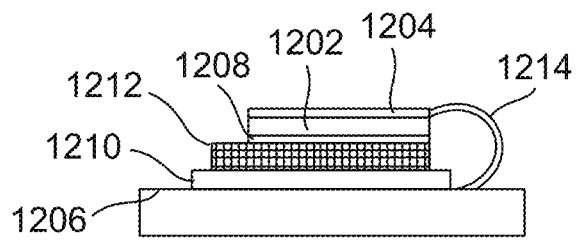
FIGS. 12A-12F are schematic illustrations showing electrical connections between a PCB and an energy transmitter on the PCB, according to some exemplary embodiments of the invention.

According to some exemplary embodiments, for example as shown in FIG. 12A, electricity is conducted from the pad 1210 to the proximal electrode via the adhesive 1212. In some embodiments, the PCB 1206 comprises a flexible region, for example flexible strip 1214 comprises electrical wiring. In some embodiments, the flexible strip 1214 electrically connects the distal electrode 1204 and the PCB 1206 electrical wiring.

Figure 12B:
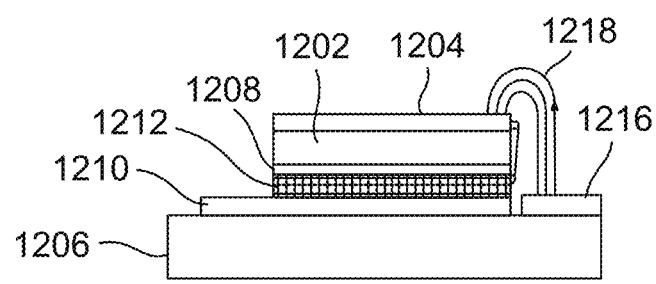

According to some exemplary embodiments, for example as shown in FIG. 12B, as in FIG. 12A, electricity is delivered to the proximal electrode 1206 from the pad 1210 via the adhesive 1212. In some embodiments, the PCB comprises a second pad 1216, which is electrically coupled to the distal electrode 1204 via wire bonding 1218 for example with Silver or Gold or Aluminum wires.

Figure 12C:
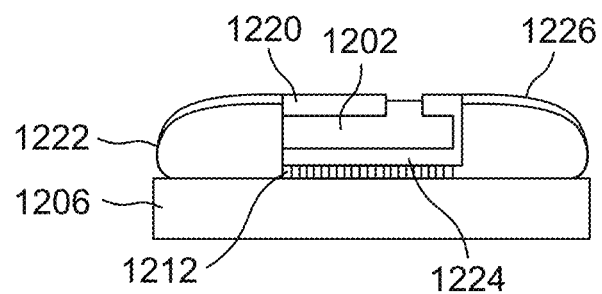

According to some exemplary embodiments, for example as shown in FIG. 12C, a first electrode 1220 of the PCB 1202 is electrically connected to the PCB 1206 by a first flexible region, for example a first flexible strip 1222. In some embodiments, the first flexible strip is optionally coupled to the first electrode 1220 by soldering. In some embodiments, a second electrode 1224 of the PCB 1202 is electrically connected to the PCB 1206 by a second flexible region, for example a second flexible strip 1226.

Figure 12D:
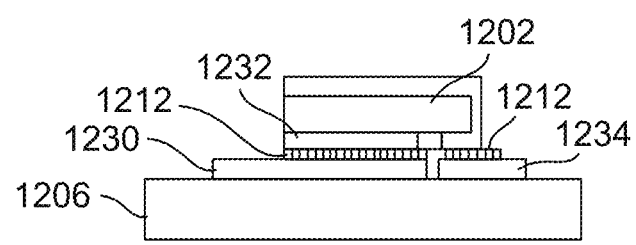

According to some exemplary embodiments, for example as shown in FIG. 12D, a first electrode of the PZT 1202 is electrically connected to a first pad 1230, via adhesive. Additionally, a second electrode 1232 of the PZT 1202 is electrically connected to a second pad 1234 of the PCB 1206, via separate region of adhesive 1212.

Figure 12E:
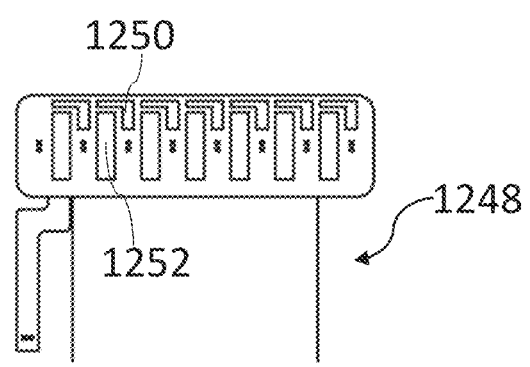
Figure 12F:
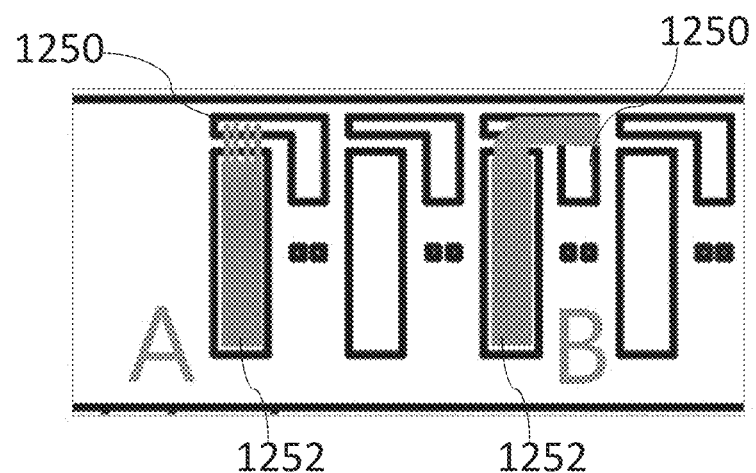

FIGS. 12E and 12F provide additional examples of electrical connection between electrical conductive pads 1250 of a PCB 1248 and at least one electrode 1252 of a piezoelectric element. In some embodiments, in A the conductive pad 1250 is electrically coupled to the electrode 1252 by wire bonding, for example using gold wires. Alternatively or additionally, in B the conductive pad 1250 is electrically coupled to the electrode 1252 by welding, for example gap welding. In some embodiments, the gap welding is performed using at least one silver strip.

Exemplary Electrical Insulation of PCB Connectors

Figure 13A:
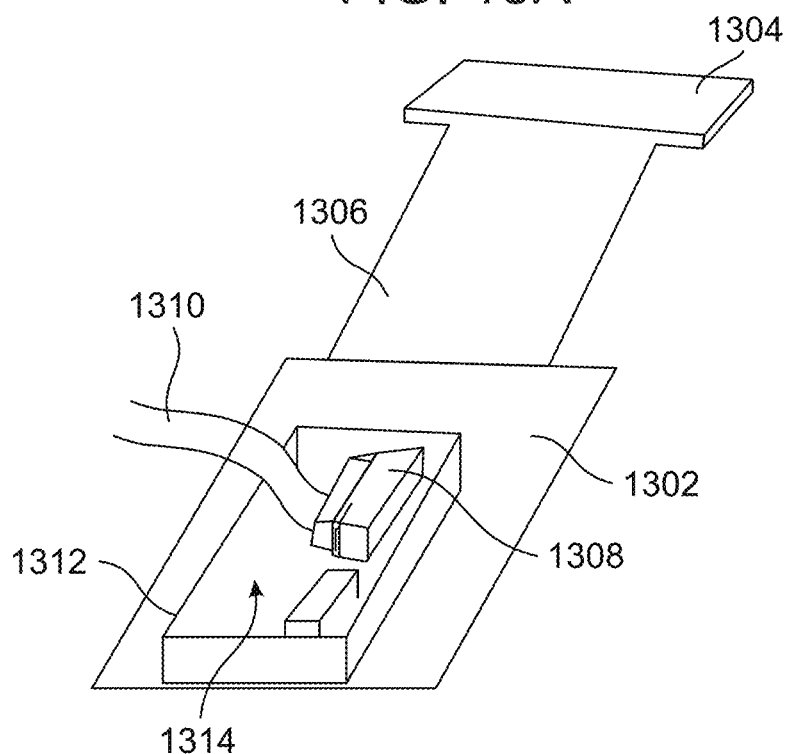
FIGS. 13A-13C are schematic illustrations showing an electrically isolated region surrounding electrical connectors of the PCB, according to some exemplary embodiments of the invention.
Figure 13B:
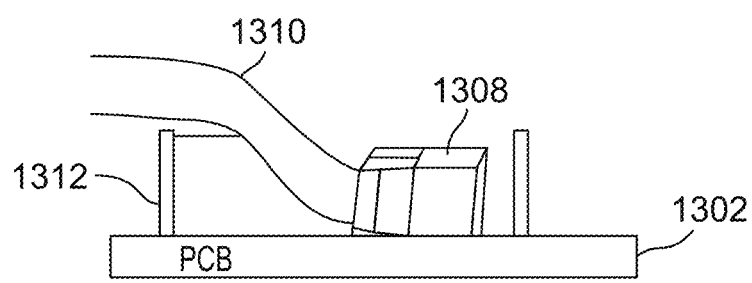
Figure 13C:
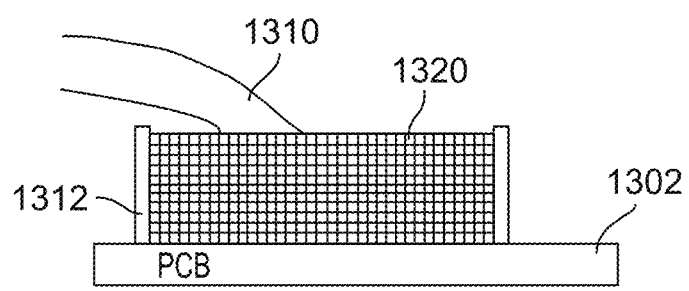

Reference is now made to FIGS. 13A-13C, depicting selective insulation of PCB electrical connectors, according to some exemplary embodiments of the invention.

According to some exemplary embodiments, for example as shown in FIG. 13A, a rigid region 1302 of a PCB, for example an applicator PCB, is coupled and is electrically connected to a second rigid region 1304 of a PCB, for example an energy transmitters PCB, via flexible region 1306. In some embodiments, electrical wiring within the flexible region 1306 electrically interconnect wiring of the applicator PCB 1302 which optionally comprises at least one electrical connector 1308, and wiring of the energy transmitters PCB 1304. In some embodiments, the at least one connector 1308, is electrically connectable to an electric braid 1310 which is electrically connectable to a control unit of the applicator.

According to some exemplary embodiments, the at least one connector 1308 is surrounded by a barrier 1312 defining an insulation region 1314 which includes the at least one connector 1308. In some embodiments, the barrier 1312 is configured to trap an insulating material within the boundaries of the insulating region 1314. In some embodiments, the insulation material comprises a self-hardening material, for example a gel.

Figure 14A:
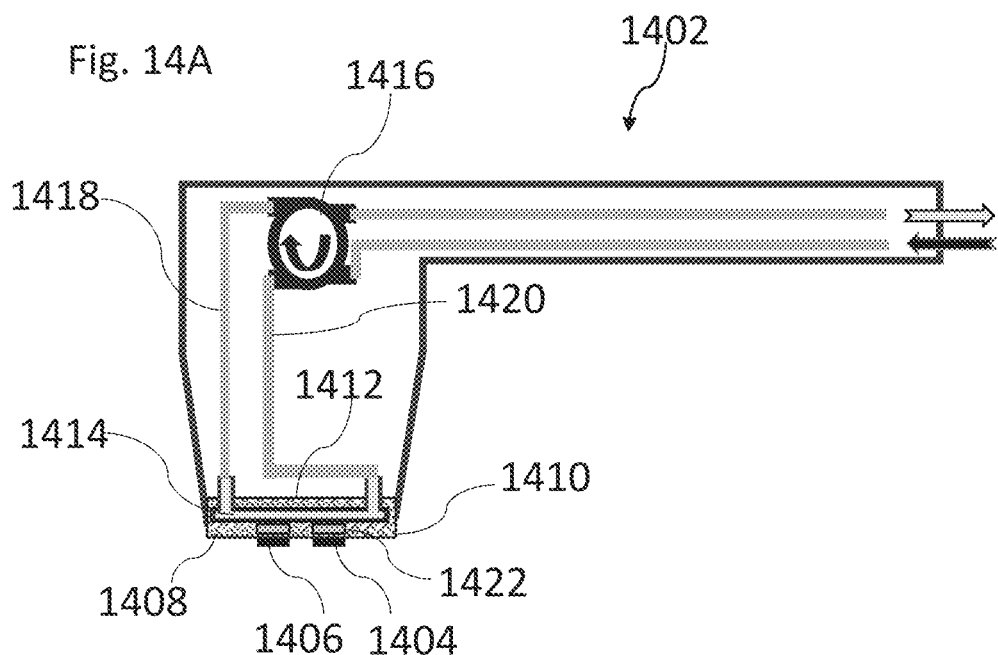
FIGS. 14A-14C are schematic illustrations of an applicator comprising one or more units of an energy transmitting assembly, according to some exemplary embodiments of the invention.
Figure 14B:
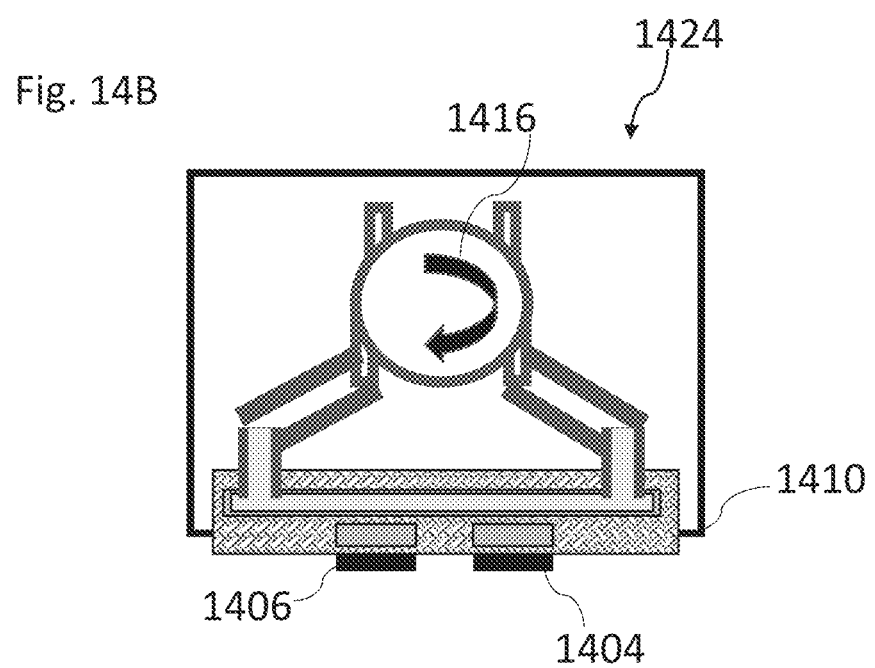
Figure 14C:
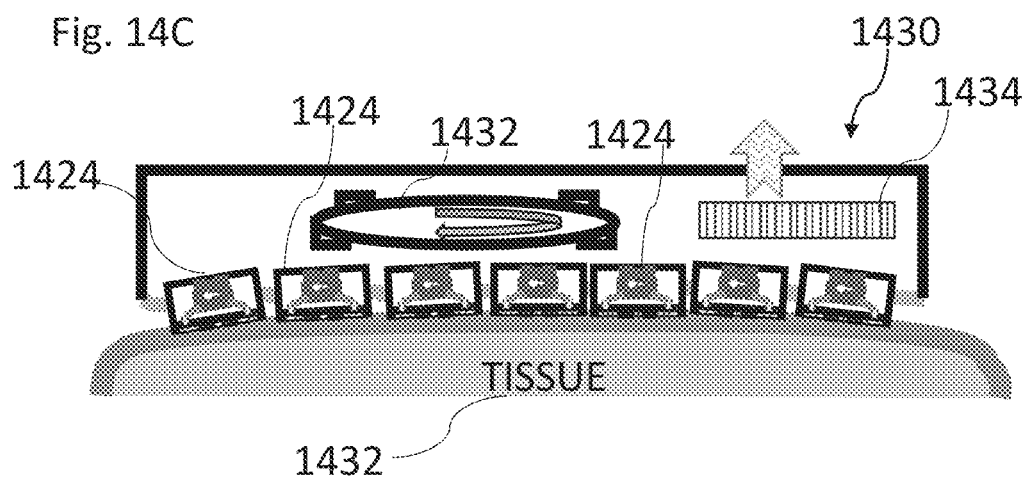

According to some exemplary embodiments, for example as shown in FIG. 14C, an insulating material 1320 is placed within the barrier 1312.

Exemplary Applicator

Reference is now made to FIGS. 14A-14C, depicting an applicator, according to some exemplary embodiments of the invention.

According to some exemplary embodiments, applicator 1402 comprises at least one energy transmitter, for example ultrasound transducers 1404 and 1406 mounted on a surface 1408 of a PCB 1410. In some embodiments, the applicator 1402 comprises at least one cooling element associated with the PCB 1410 via a surface 1412 which is different from the surface 1408 on which the transducers 1404 and 1406 are mounted.

According to some exemplary embodiments, the at least one cooling element comprises at least one cooling channel 1414, passing within the PCB 1410 and is functionally coupled to at least one pump 1416, for example via at least one inlet channel 1418 and/or at least one outlet channel 1420. In some embodiments, the at least one pump 1416 is configured to circulate cooling fluid within the cooling channel 1414, for example to cool the ultrasound transducers 1404 and 1406, and/or tissue contacting the surface 1408 directly or indirectly via at least one insulation layer. In some embodiments, the PCB 1410 comprises at least one heat-conducting region 1422 between each or at least some of the ultrasound transducers 1404 and 1406, and the cooling channel 1414.

According to some exemplary embodiments, an applicator comprises a plurality of energy transmitting sub-assemblies, for example as shown in FIG. 14B.

According to some exemplary embodiments, each energy transmitting sub-assembly, for example sub-assembly 1424 comprises the PCB 1410 with the transducers 1404 and 1406, and the cooling channel, for example as described in FIG. 14A.

According to some exemplary embodiments, an applicator 1430 comprises a plurality units of sub-assembly 1424, arranged side-by-side, next to a skin contacting surface of the applicator 1430, facing and/or placed in contact with tissue. In some embodiments, the plurality sub-assemblies are coupled to at least one central cooling element of the applicator, for example a pump 1432 configured to circulate cooling fluid through each assembly 1424 of the plurality of assemblies. Additionally or alternatively, each assembly is air cooled using at least one fan.

According to some exemplary embodiments, a number of sub-assemblies and/or an arrangement of the sub-assemblies within an applicator is determined according to specific cosmetic or therapeutic application. Alternatively or additionally, a number of sub-assemblies and/or an arrangement of the sub-assemblies within an applicator is determined according to the type of the treated tissue and/or the anatomy of the tissue.

PCB with Multi-Energy Modalities

Figure 15:
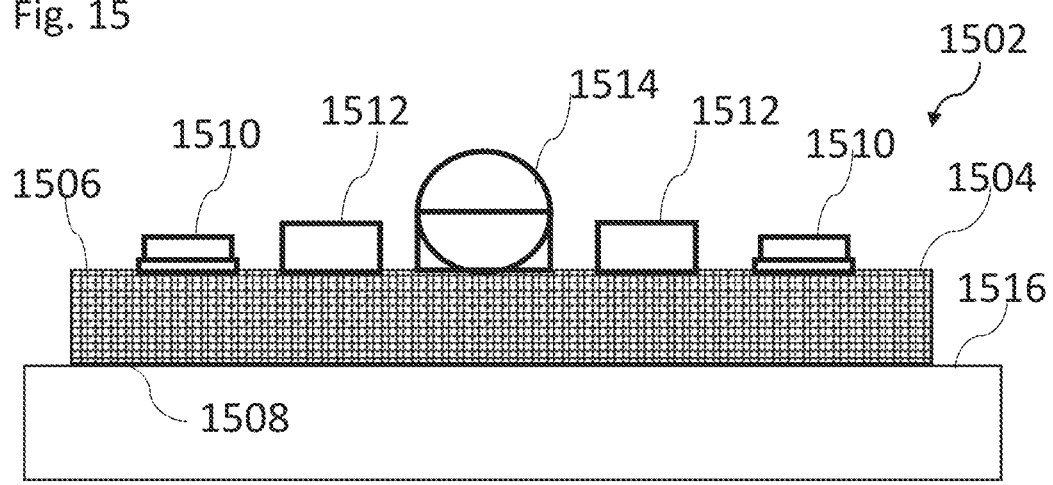
FIG. 15 is a schematic illustration of an energy transmitting assembly comprises at least two different types of energy transmitters on a PCB surface, according to some exemplary embodiments of the invention.

According to some exemplary embodiments, an energy-emitting assembly comprises a PCB, and at least two types of energy transmitters are coupled to the PCB surface. A potential advantage of having more than one type of energy transmitter may be to allow a wider range of therapy by treating different types of tissues and/or at different depth in the tissue, each by a different type of energy transmitter. Reference is now made to FIG. 15, depicting an energy emitting assembly with different types of energy transmitters, according to some exemplary embodiments of the invention.

According to some exemplary embodiments, assembly 1502 comprises a PCB having a first surface 1506 and a second surface 1508. In some embodiments, the assembly comprises at least two types of energy transmitters, for example a piezoelectric element 1510, a RF electrode 1512 and/or a laser diode 1514 coupled to the first surface 1506. In some embodiments, the second surface 1508 is associated with a cooling element 1516, for example as previously described in FIG. 1 and in other figures of the application.

Exemplary PCB Wiring

Figure 16A:
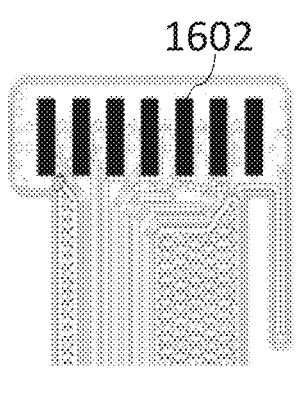
FIGS. 16A-16F are schematic illustrations of PCB wiring and layers, according to some exemplary embodiments of the invention.
Figure 16B:
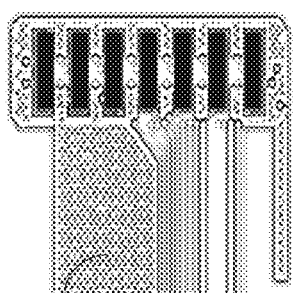
Figure 16C:
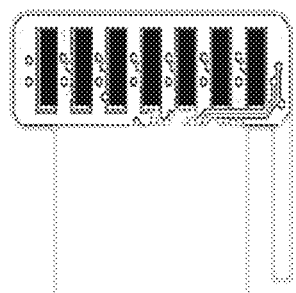
Figure 16D:
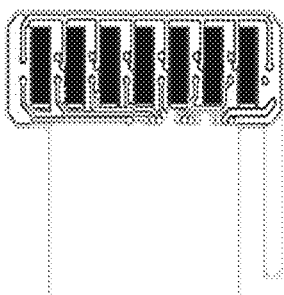
Figure 16E:
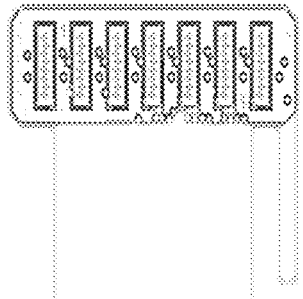
Figure 16F:
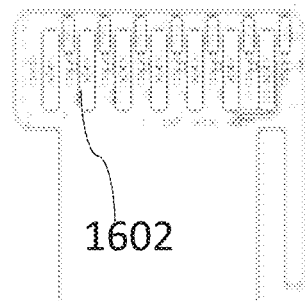

Reference is now made to FIGS. 16A-16F depicting different layers of a PCB, according to some exemplary embodiments of the invention. In some embodiments, for example as shown in FIGS. 16A-16F, a PCB is formed from several layers. Each figure represents a different layer of a PCB. The figures are arranged from a layer of the PCB that is a layer in a most distal position facing skin surface (FIG. 16A) to a most proximal layer closer to a cooling element (FIG. 16F).

According to some exemplary embodiments, each cavity, for example cavity 1602, has a polygonal cross-section. Alternatively, a cavity has an oval or a round cross-section. In some embodiments, cavity 1602 has a cross-section of a quadrangle, for example a rectangle, having dimensions of at least about 2 mm×about 1 mm, for example about 4 mm×about 2 mm, about 5 mm×about 2 mm, about 6 mm×about 2 mm, or any intermediate, smaller or larger dimensions.

According to some exemplary embodiments, a layer shown in FIG. 16F comprises copper or gold or silver or gold coated copper, or carbon fibers, in a planned location of a cavity 1602. In some embodiments, electrical wiring 1604 in layer shown in FIG. 16B, are formed from an electric conductive material, for example copper.

As used herein with reference to quantity or value, the term "about" means "within +10% of".

The terms "comprises", "comprising", "includes", "including", "has", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular forms "a", "an" and "the" include plural references unless the context clearly dictates otherwise. For example, the term "a compound" or "at least one compound" may include a plurality of compounds, including mixtures thereof.

Throughout this application, embodiments of this invention may be presented with reference to a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as "from 1 to 6" should be considered to have specifically disclosed subranges such as "from 1 to 3", "from 1 to 4", "from 1 to 5", "from 2 to 4", "from 2 to 6", "from 3 to 6", etc.; as well as individual numbers within that range, for example, 1, 2, 3, 4, 5, and 6. This applies regardless of the breadth of the range.

Whenever a numerical range is indicated herein (for example "10-15", "10 to 15", or any pair of numbers linked by these another such range indication), it is meant to include any number (fractional or integral) within the indicated range limits, including the range limits, unless the context clearly dictates otherwise. The phrases "range/ranging/ranges between" a first indicate number and a second indicate number and "range/ranging/ranges from" a first indicate number "to", "up to", "until" or "through" (or another such range-indicating term) a second indicate number are used herein interchangeably and are meant to include the first and second indicated numbers and all the fractional and integral numbers therebetween.

Unless otherwise indicated, numbers used herein and any number ranges based thereon are approximations within the accuracy of reasonable measurement and rounding errors as understood by persons skilled in the art.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

In addition, any priority document(s) of this application is/are hereby incorporated herein by reference in its/their entirety.

What is claimed is:

1. An energy transmitting assembly unit, comprising:
   a plurality of ultrasound transducers;
   a thin rigid circuit board having a first surface and a second surface and a thickness up to 3 mm, wherein said plurality of ultrasound transducers are mounted on said first surface;
   wherein said thin rigid circuit board comprises:
      electrical wiring in or on said thin rigid circuit board coupled to each of said plurality of ultrasound transducers;
      a plurality of spaced-apart heat conducting regions in said thin rigid circuit board positioned between said first surface and said second surface to selectively increase heat conductivity through the thin rigid circuit board, wherein at least some of said heat conducting regions are filled at least partly with a heat conducting material, wherein each of said plurality of separate heat conducting regions extends along at least 50% of a thickness of said thin rigid circuit board between said first surface and said second surface.

2. The assembly unit according to claim 1, wherein at least one of said plurality of heat conducting regions is aligned with at least one ultrasound transducer of said plurality of ultrasound transducers.

3. The assembly unit according to claim 1, wherein at least some of said plurality of heat conducting regions comprise implants of said heat conducting material introduced into openings in said thin circuit board.

4. The assembly unit according to claim 1, wherein each of said plurality of heat conducting regions is aligned with at least one ultrasound transducer of said plurality of ultrasound transducers mounted on said first surface and is positioned to selectively increase heat conductivity from said at least one ultrasound transducer through the thin circuit board.

5. The assembly unit according to claim 1, wherein said thin rigid circuit board is formed from layers, and wherein at least one heat conducting region of said plurality of heat conducting regions penetrates through at least 50% of said layers.

6. The assembly unit according to claim 1, wherein said heat conducting material comprises at least one of, Copper, Gold, Silver, Silver Epoxy and Gold Epoxy.

7. The assembly unit according to claim 1, wherein each of said plurality of heat conducting regions in said circuit board is aligned and extends towards a single ultrasound transducer of said plurality of ultrasound transducers on said first surface.

8. The assembly unit according to claim 1, wherein said plurality of heat conducting regions and/or said second surface are configured to be coupled to a cooling element.

9. The assembly unit according to claim 8, wherein said plurality of heat conducting regions comprise a plurality of cavities extending from said second surface through the thin circuit board towards said plurality of ultrasound transducers, and wherein each of said plurality of cavities is shaped and sized to receive a portion of said cooling element.

10. The assembly unit according to claim 9, comprising said cooling element, and wherein said cooling element comprises a heat conducting base holder having at least one extension which is shaped and sized to penetrate into at least one cavity of said plurality of cavities when said thin rigid circuit board is coupled to said cooling element.

11. The assembly unit according to claim 10, wherein said heat conducting base holder comprises a plurality of extensions shaped as fingers, wherein each of said plurality of extensions is shaped and sized to penetrate into a cavity of said plurality of cavities.

12. The assembly unit according to claim 11, wherein each of said plurality of cavities comprises a thermally conductive filler material configured to fill gaps between each extension and the thin circuit board.

13. The assembly unit according to claim 9, wherein said plurality of cavities comprise channels configured to circulate cooling fluid from said cooling element within said thin circuit board.

14. The assembly unit according to claim 1, comprising at least one temperature sensor mounted on said first surface between two ultrasound transducers of said plurality of ultrasound transducers.

15. The assembly unit according to claim 14, wherein said electrical wiring of said thin rigid circuit board is electrically connected to said at least one temperature sensor.

16. The assembly unit according to claim 14, wherein said thin rigid circuit board comprises at least one thermally insulated region positioned inside said circuit board between at least two heat conducting regions of said plurality of heat conducting regions, and is aligned with said at least one temperature sensor.

17. The assembly unit according to claim 16, wherein said at least one thermally insulated region comprises an opening filled with thermal insulating material or an implant of thermal insulating material.

18. The assembly unit according to claim 17, wherein said thermal insulating material comprises at least one of, air, gas, glass fibers, silica particles with air.

19. The assembly unit according to claim 1, wherein said circuit board comprises an electrical-conducting pad on said first surface for each of said plurality of ultrasound transducers, and wherein each of said plurality of ultrasound transducers is coupled to said electrical-conducting pad via an electrical conductive glue.

20. The assembly unit according to claim 19, wherein said electrical conductive glue comprises a plurality of electrical conductive particles within a non-conductive glue matrix.

21. The assembly unit according to claim 1, wherein said plurality of ultrasound transducers are thin ultrasound transducers arranged as an array on said first surface of said thin circuit board.

22. The assembly unit according to claim 1, wherein said thin rigid circuit board comprises thermally insulating regions in said thin rigid circuit board and between said plurality of heat conducting regions.

23. The assembly unit according to claim 22, wherein said thermally insulating regions comprises an opening filled with thermal insulating material or an implant of thermal insulating material.

24. The assembly unit according to claim 1, wherein said thin rigid circuit board is a rigid and thin printed circuit board formed from layers, and wherein said first surface and/or said second surface are planar.

25. An energy transmitting assembly unit, comprising:
a plurality of ultrasound transducers;
a thin rigid circuit board having a first surface and a second surface and a thickness up to 3 mm, wherein said plurality of ultrasound transducers are mounted on said first surface;
wherein said thin rigid circuit board comprises:
electrical wiring in or on said thin rigid circuit board coupled to each of said plurality of ultrasound transducers;
a plurality of spaced-apart heat conducting regions in said thin rigid circuit board positioned between said first surface and said second surface to selectively increase heat conductivity through the thin rigid circuit board, wherein at least some of said heat conducting regions are filled at least partly with a heat conducting material.

\* \* \* \* \*